US011688469B2

(12) United States Patent
Zhao et al.

(10) Patent No.: US 11,688,469 B2
(45) Date of Patent: Jun. 27, 2023

(54) NON-VOLATILE MEMORY WITH SUB-BLOCK BASED SELF-BOOSTING SCHEME

(71) Applicant: SanDisk Technologies LLC, Addison, TX (US)

(72) Inventors: Dengtao Zhao, Santa Clara, CA (US); Gerrit Jan Hemink, San Ramon, CA (US); Xiang Yang, Santa Clara, CA (US); Ken Oowada, Fujisawa (JP); Guirong Liang, Santa Clara, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/399,498

(22) Filed: Aug. 11, 2021

(65) Prior Publication Data

US 2023/0050955 A1 Feb. 16, 2023

(51) Int. Cl.
| | | |
|---|---|---|
| *G11C 16/04* | (2006.01) | |
| *G11C 16/34* | (2006.01) | |
| *H01L 25/18* | (2023.01) | |
| *H01L 23/00* | (2006.01) | |
| *G11C 11/56* | (2006.01) | |
| *G11C 16/10* | (2006.01) | |
| *G11C 16/16* | (2006.01) | |
| *G11C 16/24* | (2006.01) | |
| *H01L 25/065* | (2023.01) | |

(52) U.S. Cl.
CPC ...... *G11C 16/3427* (2013.01); *G11C 11/5628* (2013.01); *G11C 11/5635* (2013.01); *G11C 11/5671* (2013.01); *G11C 16/0483* (2013.01); *G11C 16/10* (2013.01); *G11C 16/16* (2013.01); *G11C 16/24* (2013.01); *H01L 24/08* (2013.01); *H01L 25/0657* (2013.01); *H01L 25/18* (2013.01); *H01L 2224/08145* (2013.01); *H01L 2225/06506* (2013.01); *H01L 2225/06541* (2013.01); *H01L 2225/06562* (2013.01); *H01L 2924/1431* (2013.01); *H01L 2924/14511* (2013.01)

(58) Field of Classification Search
CPC ............ G11C 16/3427; G11C 11/5628; G11C 11/5635; G11C 11/5671; G11C 16/0483; G11C 16/10; G11C 16/16; G11C 16/24; H01L 24/08; H01L 25/0657; H01L 25/18; H01L 2224/08145; H01L 2225/06506; H01L 2225/06541; H01L 2225/06562; H01L 2924/1431; H01L 2924/14511
USPC ..................................................... 365/185.02
See application file for complete search history.

(56) References Cited

U.S. PATENT DOCUMENTS

| | | |
|---|---|---|
| 6,107,658 A | 8/2000 | Itoh et al. |
| 7,161,833 B2 | 1/2007 | Hemink |
| (Continued) | | |

*Primary Examiner* — Tha-O H Bui
(74) *Attorney, Agent, or Firm* — Vierra Magen Marcus LLP

(57) ABSTRACT

To help reduce program disturbs in non-selected NAND strings of a non-volatile memory, a sub-block based boosting scheme in introduced. For a three dimensional NAND memory structure, in which the memory cells above a joint region form an upper sub-block and memory cells below the joint region form a lower sub-block, dummy word lines in the joint region act as select gates to allow boosting at the sub-block level when the lower block is being programmed in a reverse order.

19 Claims, 23 Drawing Sheets

(56) References Cited

U.S. PATENT DOCUMENTS

| | | | |
|---|---|---|---|
| 7,428,165 B2 * | 9/2008 | Oowada | G11C 16/0483 |
| | | | 365/185.26 |
| 7,471,566 B2 | 12/2008 | Hemink | |
| 7,577,026 B2 * | 8/2009 | Dong | G11C 16/3418 |
| | | | 365/185.28 |
| 7,672,165 B2 | 3/2010 | Pham et al. | |

* cited by examiner

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

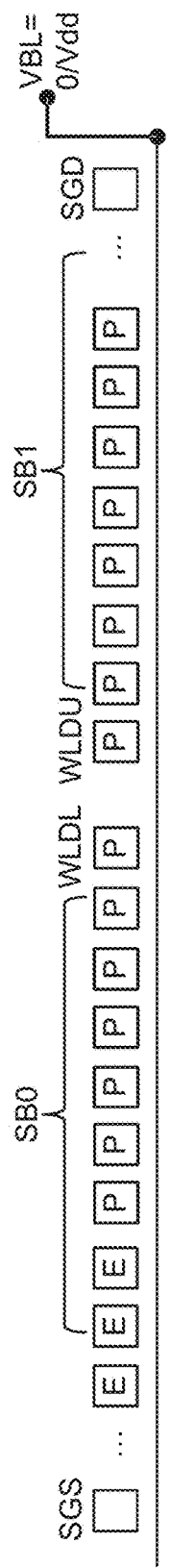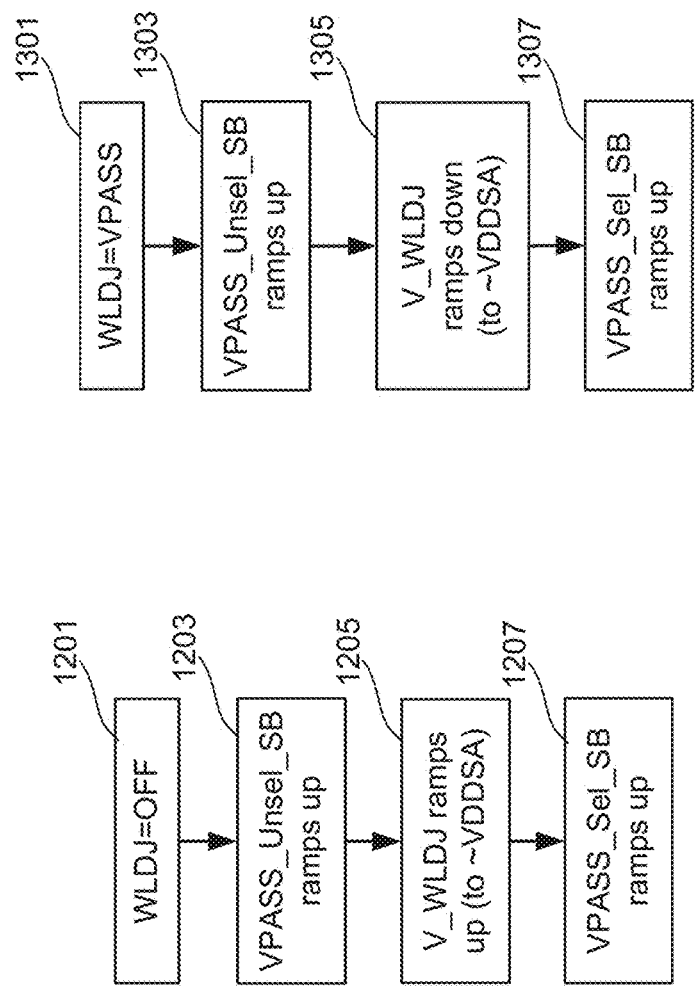
Figure 11
Figure 14A
Figure 13A
Figure 12A

NON-VOLATILE MEMORY WITH SUB-BLOCK BASED SELF-BOOSTING SCHEME

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory.

NAND memory and other non-volatile memories are subject to the phenomenon of "disturb", where one set of memory cells can have their data corrupted due to memory operations on another set of memory cells. Disturbs can occur from read, program, and erase operations. For example, a program pulse applied to a selected word line of a NAND memory can have adverse effects on the non-selected memory cells of the NAND strings, as can the application of a pass voltage to the non-selected memory cells of a selected NAND string. To maintain data integrity, it is important to reduce the amount of such data disturbs while maintaining memory performance.

BRIEF DESCRIPTION OF THE DRAWINGS

Like-numbered elements refer to common components in the different figures.

FIG. 11 is a schematic representation of a two sub-block embodiment of a partially programmed NAND string that is being written in reverse order program to illustrate the relation of elements involved in sub-block based self-boosting.

FIGS. 12A, 12B, FIGS. 13A, 13B, and FIGS. 14A, 14B present embodiments of sub-block based self-boosting schemes.

DETAILED DESCRIPTION

One technique to reduce program related disturbs while maintaining programming performance in NAND memory is local self-boosting, a scheme that is used to improve the isolation of the channel areas coupled to a selected word line while reducing program disturb levels on neighboring NAND strings. In the local self-boosting scheme, word lines to the sides of a selected word line are biased to a voltage that isolates the channel under the selected word line from the channel on either side along the NAND string. However, in some memory architectures, local self-boosting can be difficult to implement. For example, in a 3D NAND structure in which the memory cells are formed into tiers, separated by a joint region and operatable as sub-blocks, when programming the lower sub-block using reverse order programming, the typical local self-boosting scheme can be difficult to implement. To address these difficulties, the following introduces a sub-block based boosting technique in which the sub-blocks are boosted to differing levels by using dummy word lines at the joint region as select gates.

Figure 1:
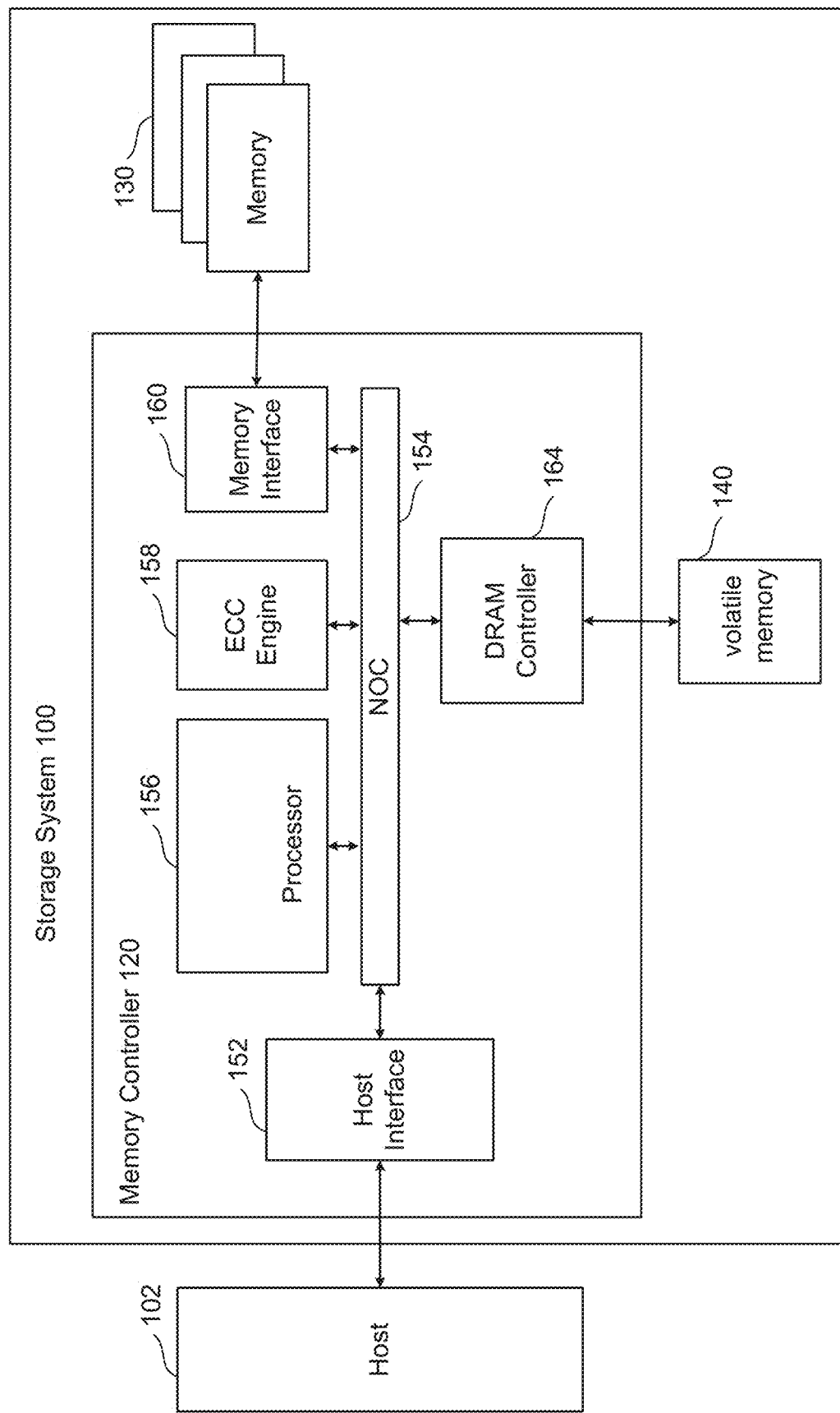
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
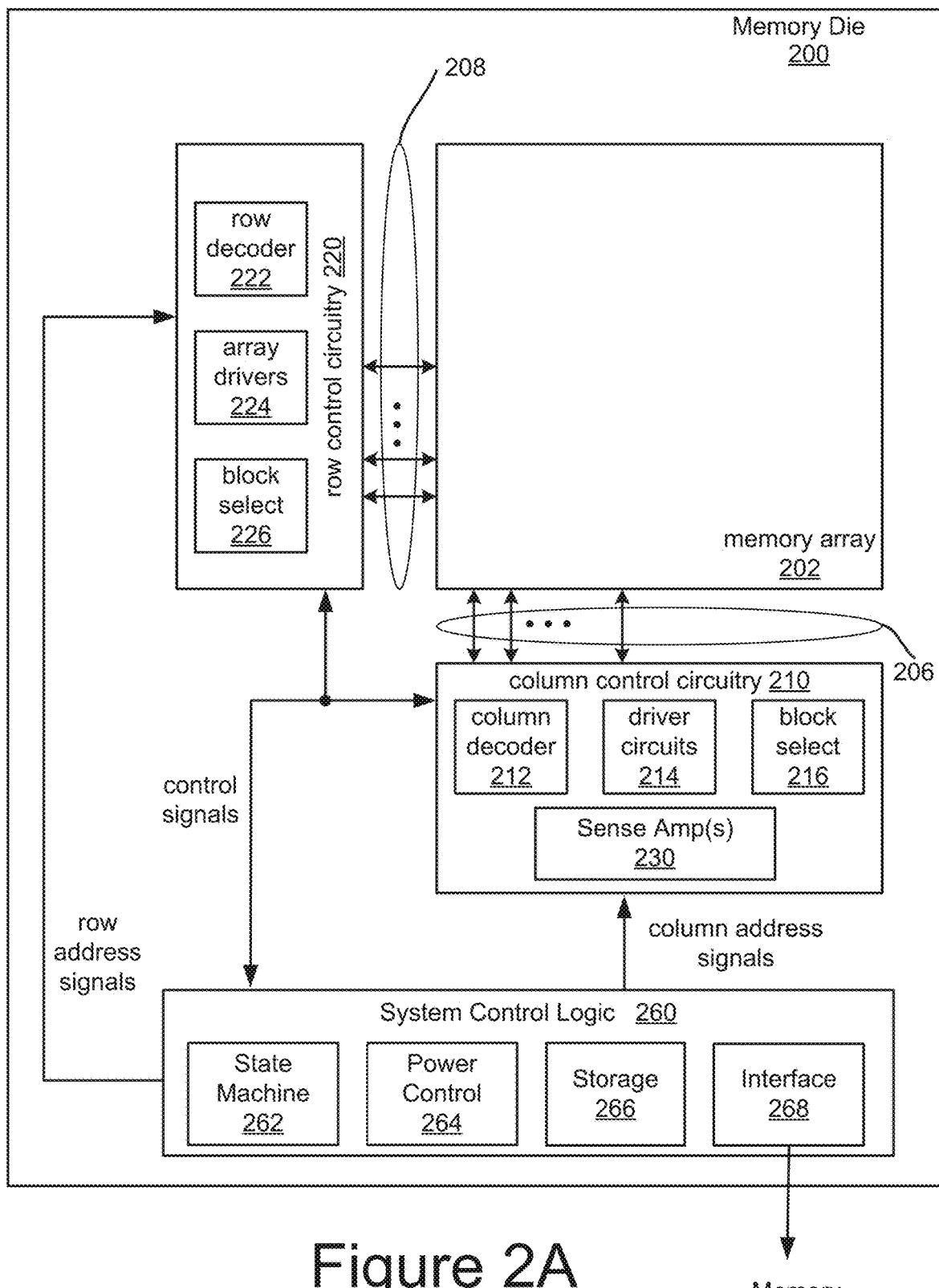
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprises non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 266

(e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
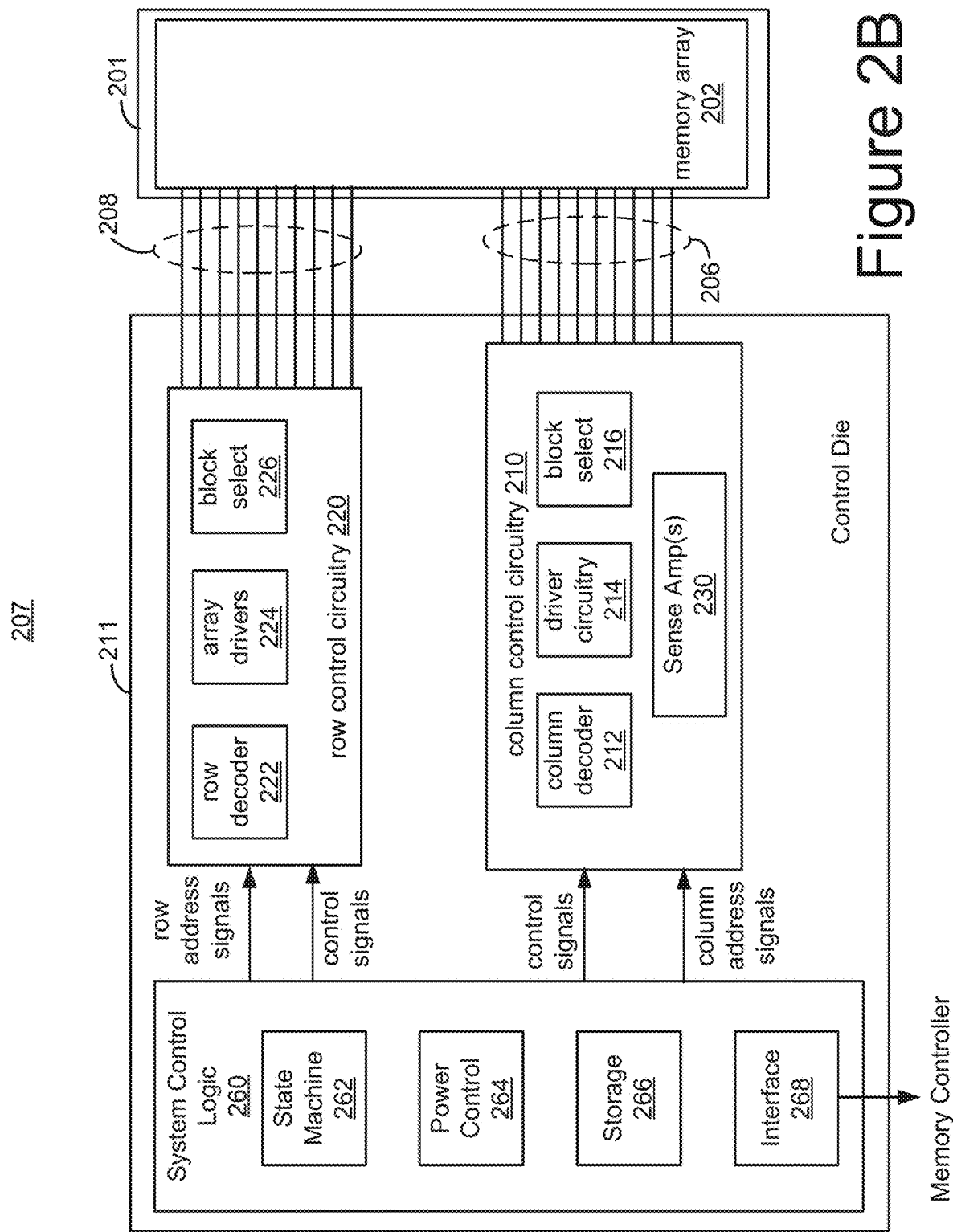
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 311 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 311 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 306, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The one or more control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 2C:
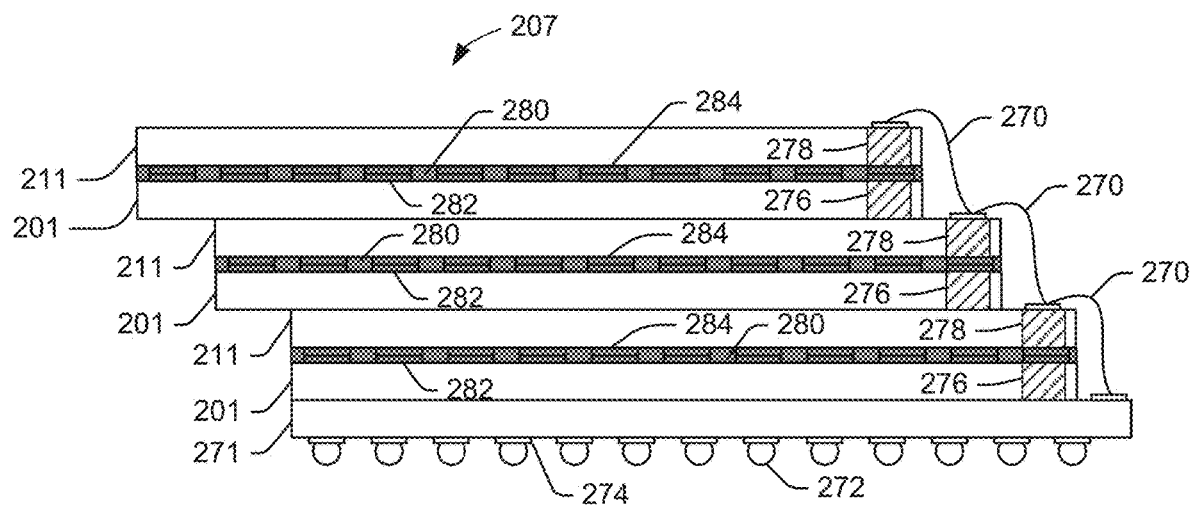
FIGS. 2C and 2D depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 2C depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 2C).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 2D:
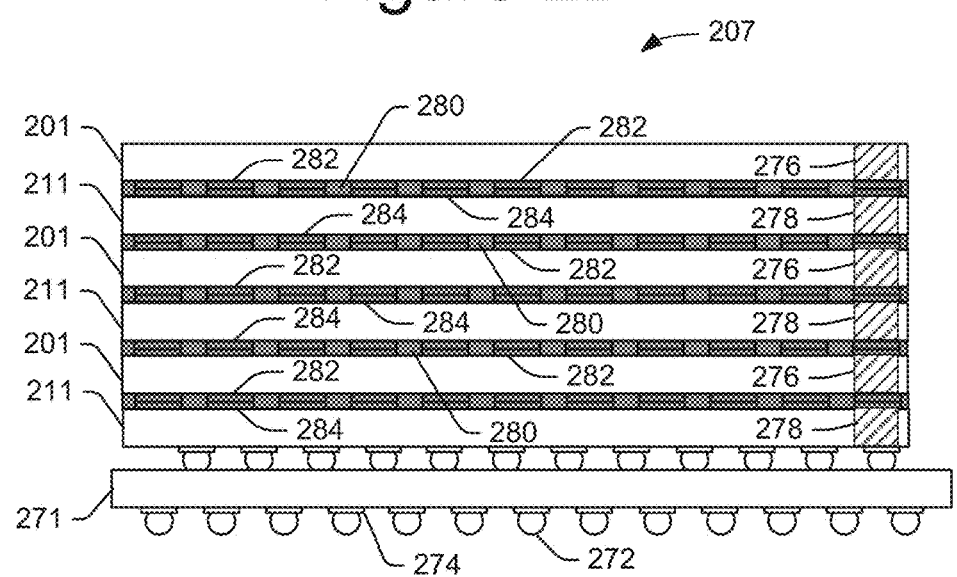

FIG. 2D depicts a side view of another embodiment of an integrated memory assembly 207 stacked on a substrate 271. The integrated memory assembly 206 of FIG. 2D has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 2C, the integrated memory assembly 207 in FIG. 2D does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 3:
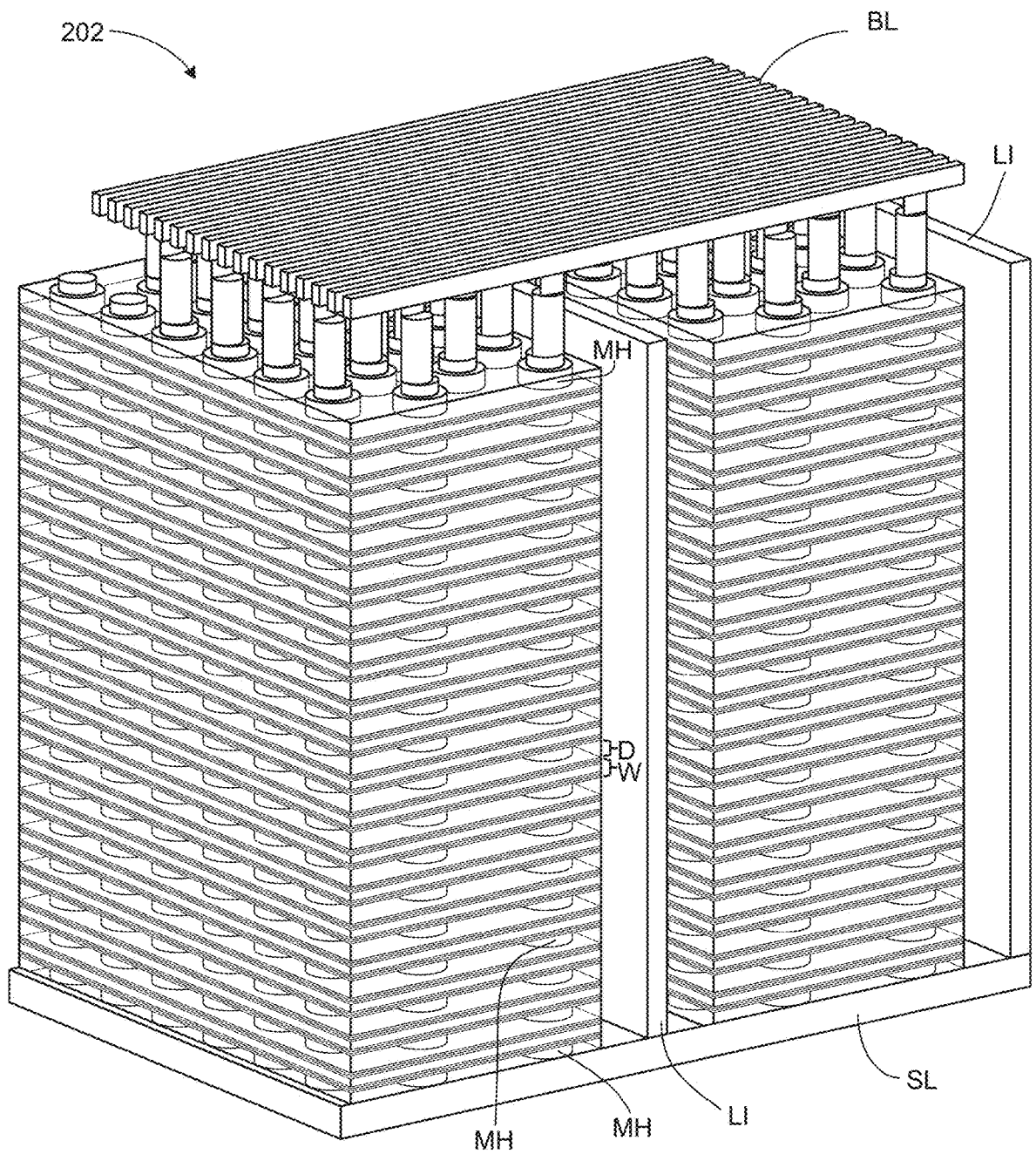
FIG. 3 is a perspective view of a portion of one embodiment of a monolithic three dimensional memory structure.

FIG. 3 is a perspective view of a portion of one example embodiment of a monolithic three dimensional memory array/structure architecture that can comprise memory structure 202, which includes a plurality non-volatile memory cells arranged as vertical NAND strings. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. More or less than 108-300 layers can also be used. As will be explained below, in one embodiment the alternating dielectric layers and conductive layers are divided into four or more regions, or "fingers", by local interconnects LI (optional). FIG. 3 shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
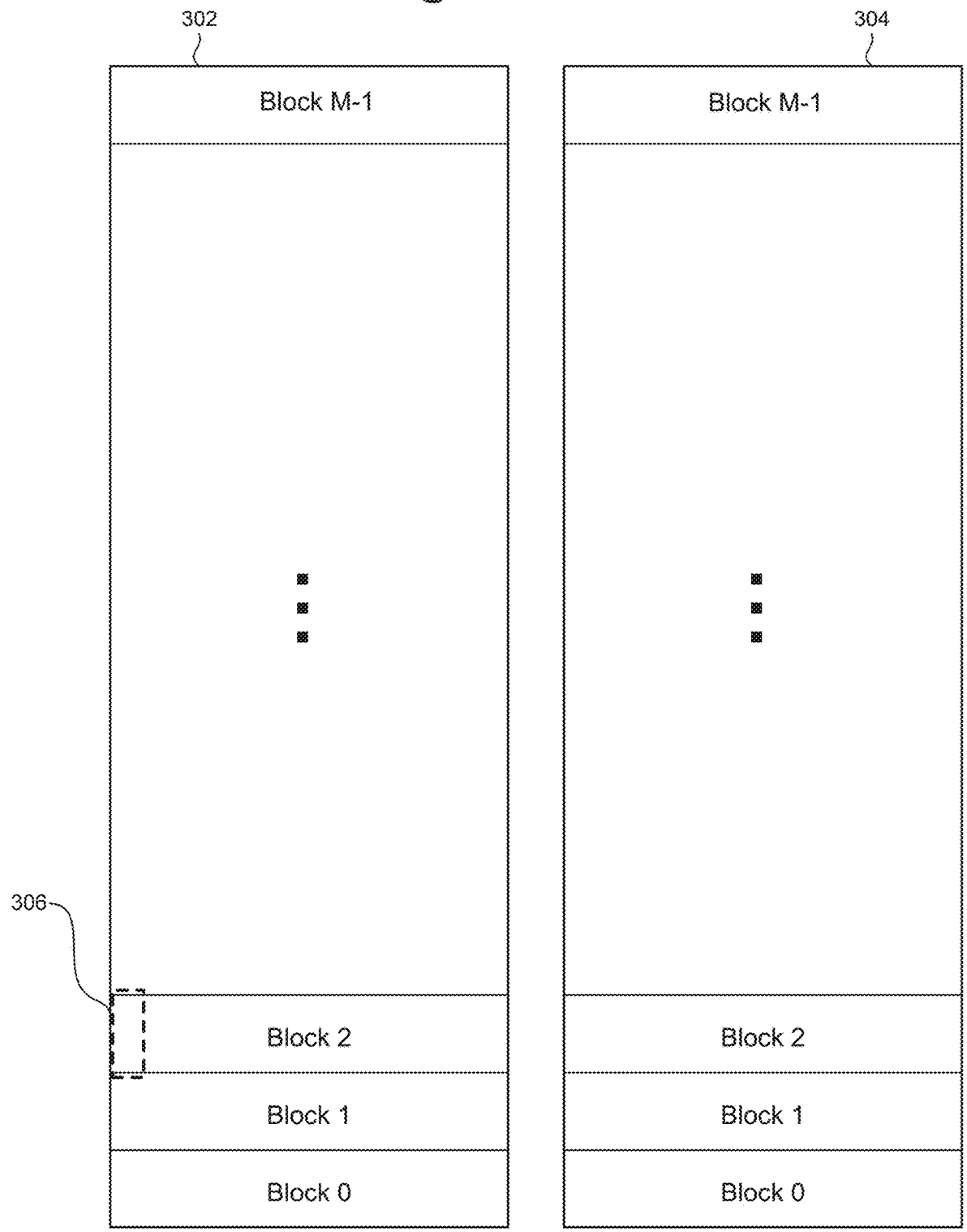
FIG. 4A is a block diagram of one embodiment of a memory structure having two planes.

FIG. 4A is a block diagram explaining one example organization of memory structure 202, which is divided into two planes 302 and 304. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a group of connected memory cells as the memory cells of a block share a common set of word lines. For example, the word lines for a block are all connected to all of the vertical NAND strings for that block. Although FIG. 4A shows two planes 302/304, more or less than two planes can be implemented. In some embodiments, memory structure 202 includes eight planes.

Figure 4B:
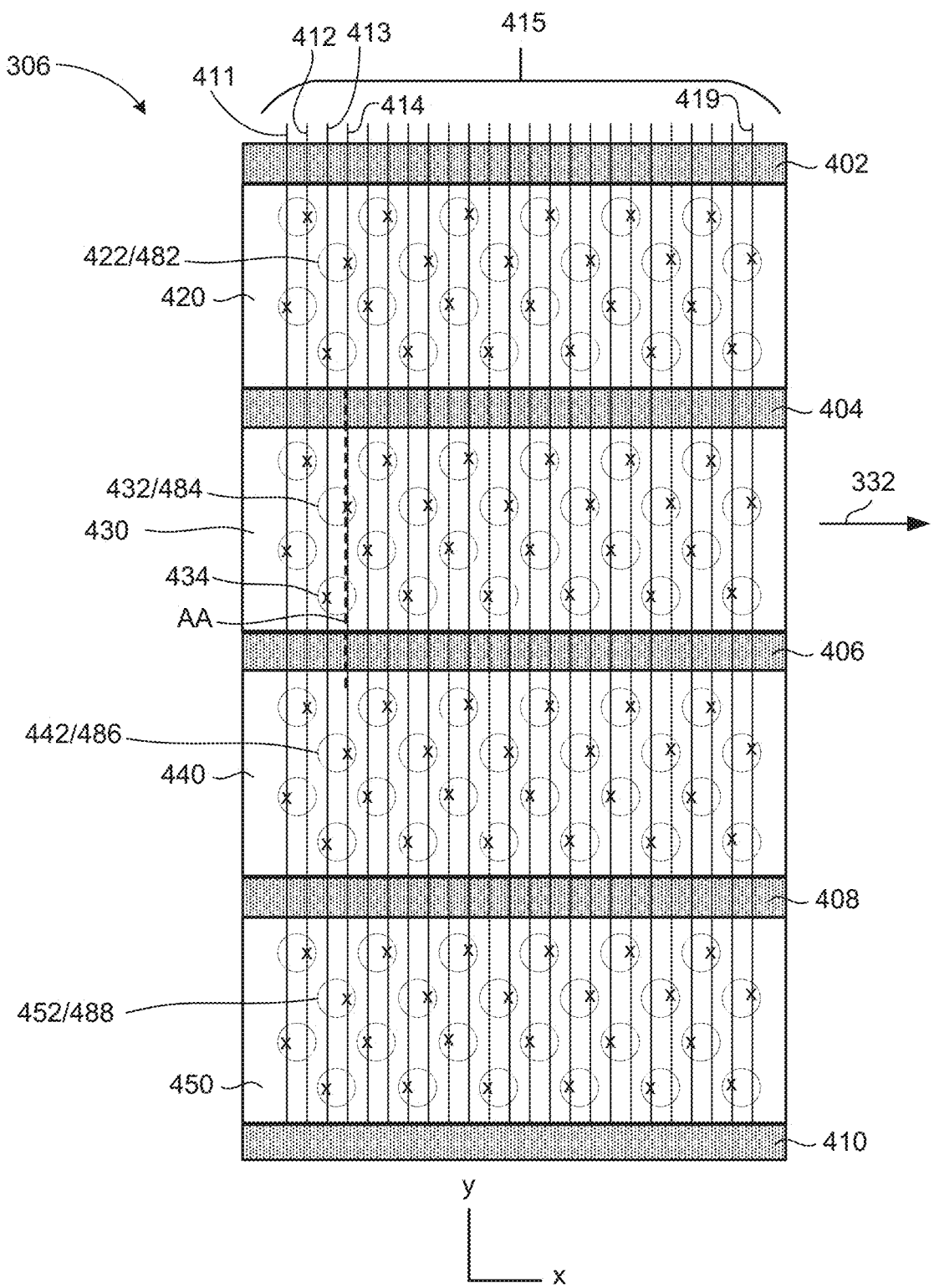
FIG. 4B depicts a top view of a portion of one embodiment of a block of memory cells.

FIGS. 4B-4E depict an example three dimensional ("3D") NAND architecture that corresponds to the structure of FIG. 3 and can be used to implement memory structure 202 of FIGS. 2A and 2B. FIG. 4B is a block diagram depicting a top view of a portion of one block from memory structure 202. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

Figure 4C:
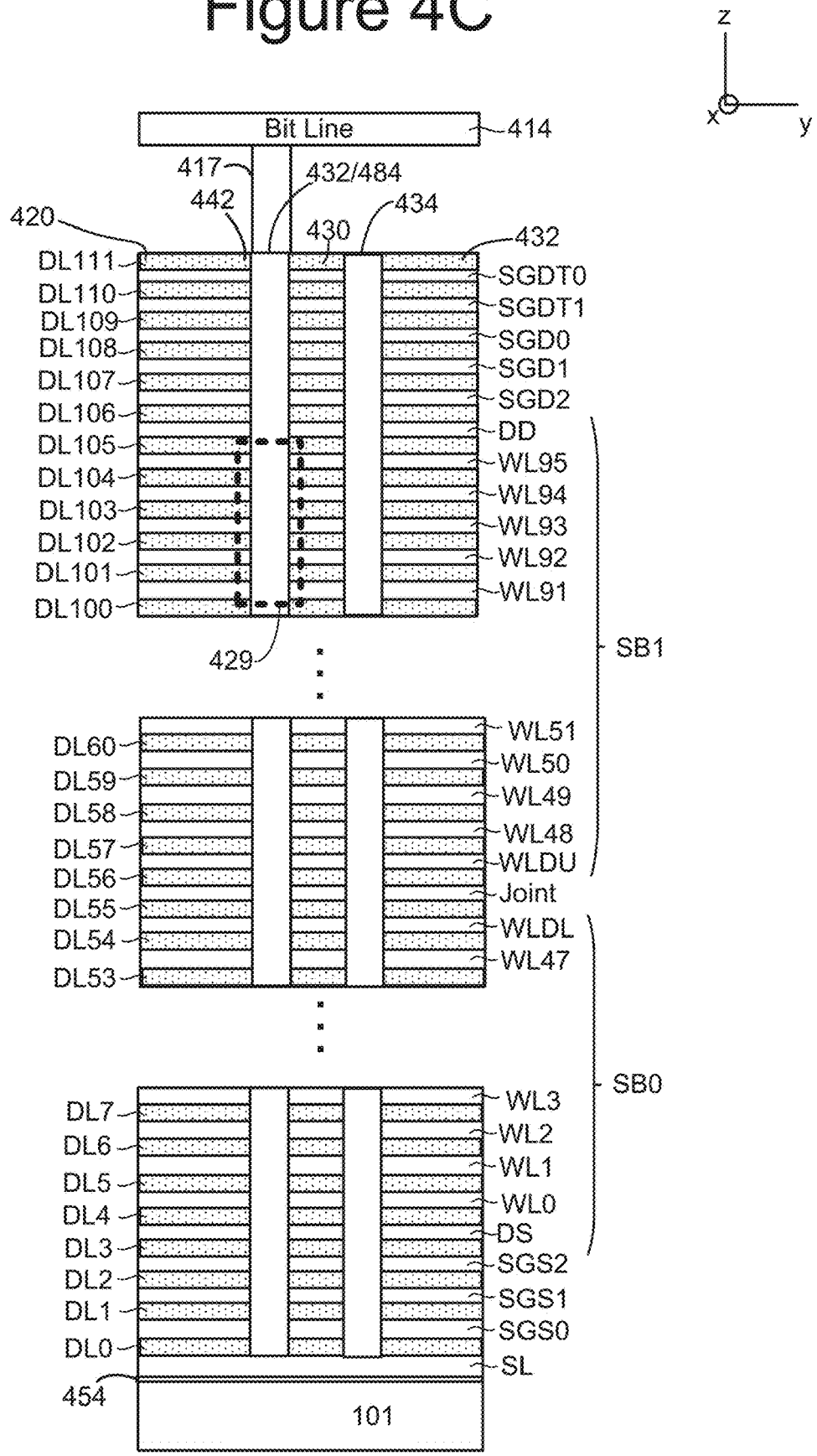
FIG. 4C depicts a cross sectional view of a portion of one embodiment of a block of memory cells.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers or sub-blocks, as, in some embodiments, erase can be performed individually on these divisions. (In the following, these divisions will be referred to as "fingers", with the term "sub-block" being used to refer to the upper and lower divisions of the 3D array structure as illustrated in FIG. 4C.) In the layers of the block that implement memory cells, the four regions are referred to as word line fingers that are separated by the local interconnects. In one embodiment, the word line fingers on a common level of a block are connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

FIG. 4C depicts a portion of one embodiment of a three dimensional memory structure 202 showing a cross-sectional view along line AA of FIG. 4B. This cross sectional view cuts through vertical columns 432 and 434 and region 430 (see FIG. 4B). The structure of FIG. 4C includes: five drain side select layers SGDT0, SGDT1, SGD0, SGD1 and SGD2; three source side select layers SGS0, SGS1, and SGS2; four dummy word line layers DD, DS, WLDL and WLDU; and ninety six data word line layers WL0-WL95 for connecting to data memory cells. Other embodiments can implement more or less than five drain side select layers, more or less than three source side select layers, more or less than four dummy word line layers, and more or less than ninety six word lines. In one embodiment, SGD0, SGD1 and SGD2 are connected together, SGDT0 and SGDT1 are connected together, and SGS0, SG1 and SGS2 are connected together. In one embodiment, SGD0, SGD1 and SGD2 are used to select a NAND string or a finger, while SGDT0 and SGDT1 are used for erase using gate induced drain leakage ("GIDL") generation.

Vertical columns 432 and 434 are depicted protruding through the drain side select layers, source side select layers, dummy word line layers and word line layers. In one embodiment, each vertical column comprises a vertical NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 417. Local interconnects 404 and 406 are also depicted.

For ease of reference, drain side select layers, source side select layers, dummy word line layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL111. For example, dielectric layers DL104 is above word line layer WL94 and below word line layer WL95. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, memory cells are arranged in NAND strings. The word line layers WL0-WL95 connect to memory cells (also called data memory cells). Dummy word line layers DD, DS, WLDL and WLDU connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. A dummy word line is connected to dummy memory cells. Drain side select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

To increase the density of data storage, block size can be increased by including more layers of word lines, increasing the height of the memory structure in the z-direction. As block size increases, this can lead to issues with block yield, block budget, the efficiency and speed of data allocation, and garbage collection. In some embodiments, a sub-block structure can be introduced to help address these issues by allowing erase and program at the sub-block level. FIG. 4C illustrates an example where the block is split into an upper sub-block SB1 and a lower sub-block SB1. Other embodiments can use larger numbers of such sub-blocks. In FIG. 4C, lower sub-block SB0 includes word lines layers WL0-WL47 and upper sub-block includes word line layers WL48-WL95. In the embodiment of FIG. 4C, the upper and lower sub-blocks are separated by a pair of dummy word lines WLDU and WLDL. Other embodiments may have more or less dummy word lines between sub-blocks and may additionally or alternatively include a non-programmable sub-block joint transistor of a different size or structure than the memory cell transistors.

Figure 4D:
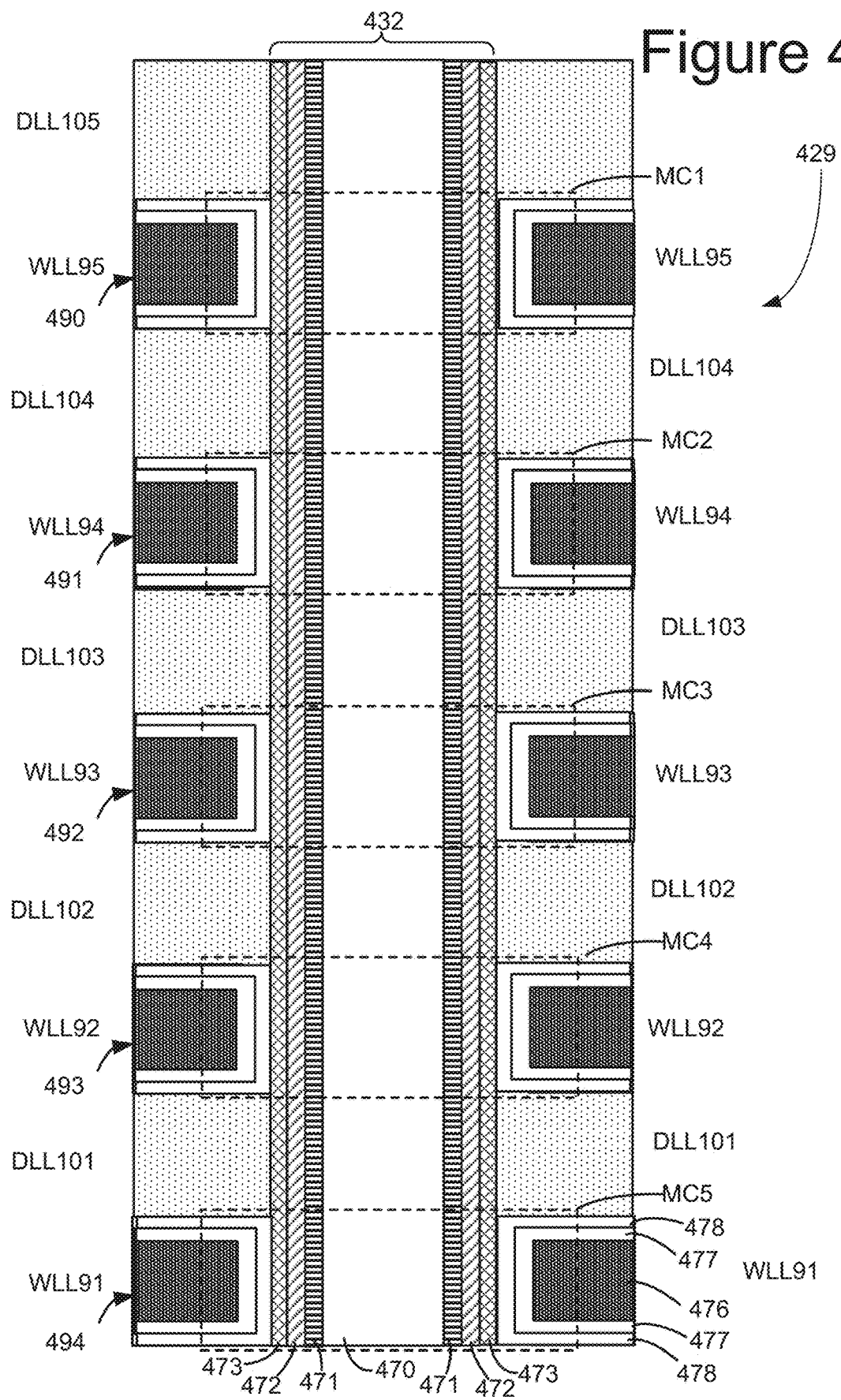
FIG. 4D is a cross sectional view of one embodiment of a vertical column of memory cells.

FIG. 4D depicts a cross sectional view of region 429 of FIG. 4C that includes a portion of vertical column 432 (a memory hole). In one embodiment, the vertical columns are round; however, in other embodiments other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4D depicts dielectric layers DLL105, DLL104, DLL103, DLL102 and DLL101, as well as word line layers WLL95, WLL94, WLL93, WLL92, and WLL91. Each of the word line layers includes a word line region 476 surrounded by an aluminum oxide layer 477, which is surrounded by a blocking oxide layer 478. In other embodiments, the blocking oxide layer can be a vertical layer parallel and adjacent to charge trapping layer 473. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4E:
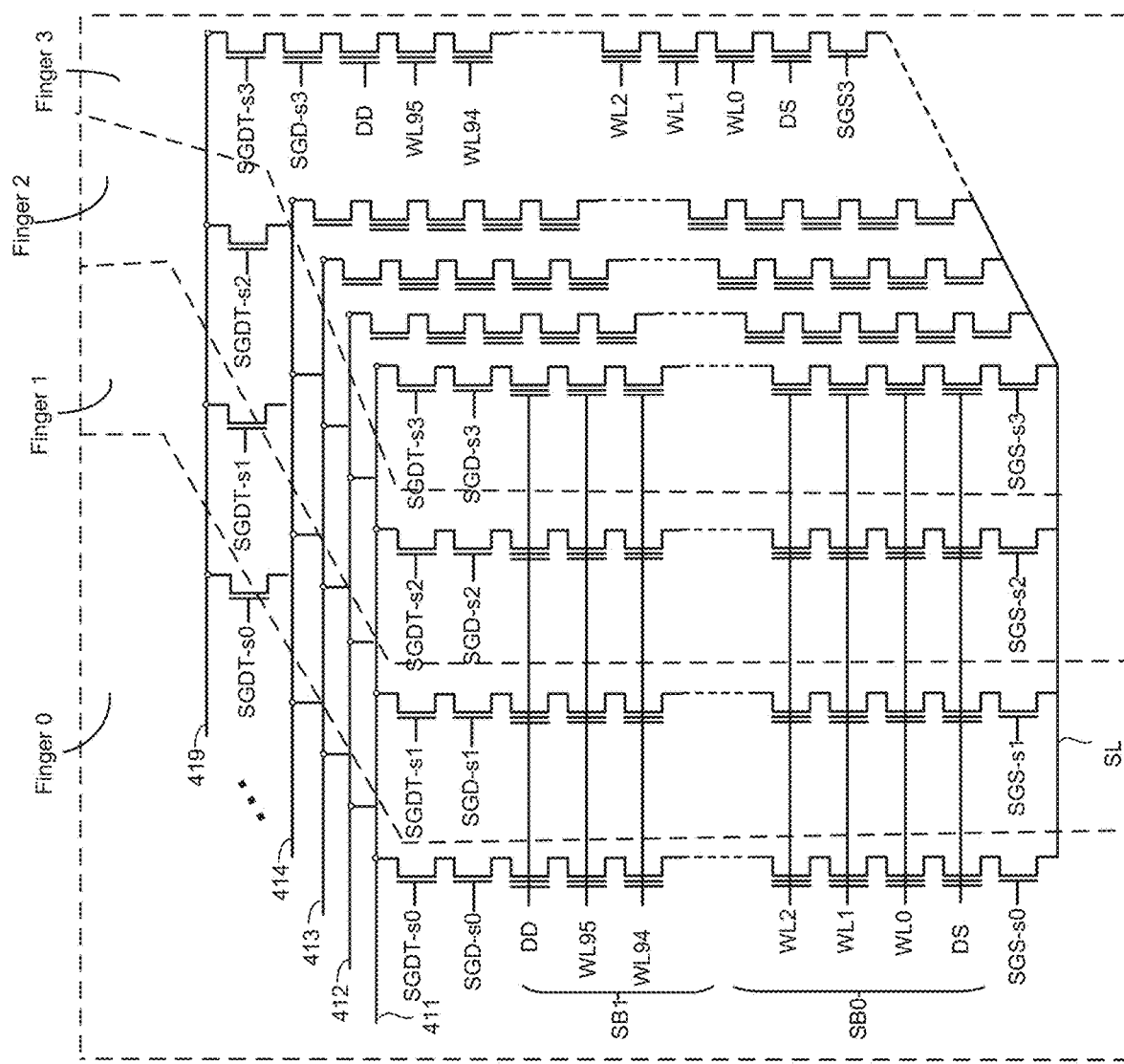
FIG. 4E is a schematic of a plurality of NAND strings showing multiple sub-blocks.

FIG. 4E is a schematic diagram of a portion of the memory depicted in in FIGS. 3-4D. FIG. 4E shows physical data word lines WL0-WL95 running across the entire block. The structure of FIG. 4E corresponds to portion 306 in Block 2 of FIGS. 4A-D, including bit lines 411, 412, 413, 414, . . . 419. Within the block, in one embodiment, each bit line is connected to four NAND strings. As mentioned above with respect to FIG. 4C, in one embodiment, SGD0, SGD1 and SGD2 are connected together to operate as a single logical select gate that is represented in FIG. 4E as SGD (SGD-s0, SGD-s1, SGD-s2, SGD-s3); SGDT0 and SGDT1 are connected together to operate as a single logical gate that is represented in FIG. 4E as SGT (SGDT-s0, SGDT-s1, SGDT-s2, SGDT-s3); and SGS0, SG1 and SGS2 are connected together to operate as a single logical select gate that is represented in FIG. 4E as SGS (SGS-s0, SGS-s1, SGS-s2, SGS-s3).

The block can also be thought of as divided into four fingers. In one embodiment the data word line layers of each finger are connected together. In one embodiment, the drain side select layers (SGD0, SGD1 and SGD2) are electrically divided by local interconnects LI (see above) into four separate drain side select lines and gates (transistors) SGD-s0, SGD-s1, SGD-s2, SGD-s3 such that there is one per finger so that each finger can be independently selected. Similarly, the SGT layers are divided by local interconnects LI (see above) into four separate lines and gates (transistors) SGDT-s0, SGDT-s1, SGDT-s2, SGDT-s3 such that there is one per finger so that GIDL can be generated separately and independently for each finger. The source side select layers (SGS0, SGS1 and SGS2) are electrically divided by local interconnects LI (see above) into four separate source side select lines and gates (transistors) SGS-s0, SGS-s1, SGS-s2, SGS-s3 such that there is one per finger so that each finger can be independently selected.

Finger 0 corresponds to those vertical NAND strings controlled by SGD-s0 and SGS-s0, Finger 1 corresponds to those vertical NAND strings controlled by SGD-s1 and SGS-s1, Finger 2 corresponds to those vertical NAND strings controlled by SGD-s2 and SGS-s2, and Finger 3 corresponds to those vertical NAND strings controlled by SGD-s3 and SGS-s3.

Figure 4F:
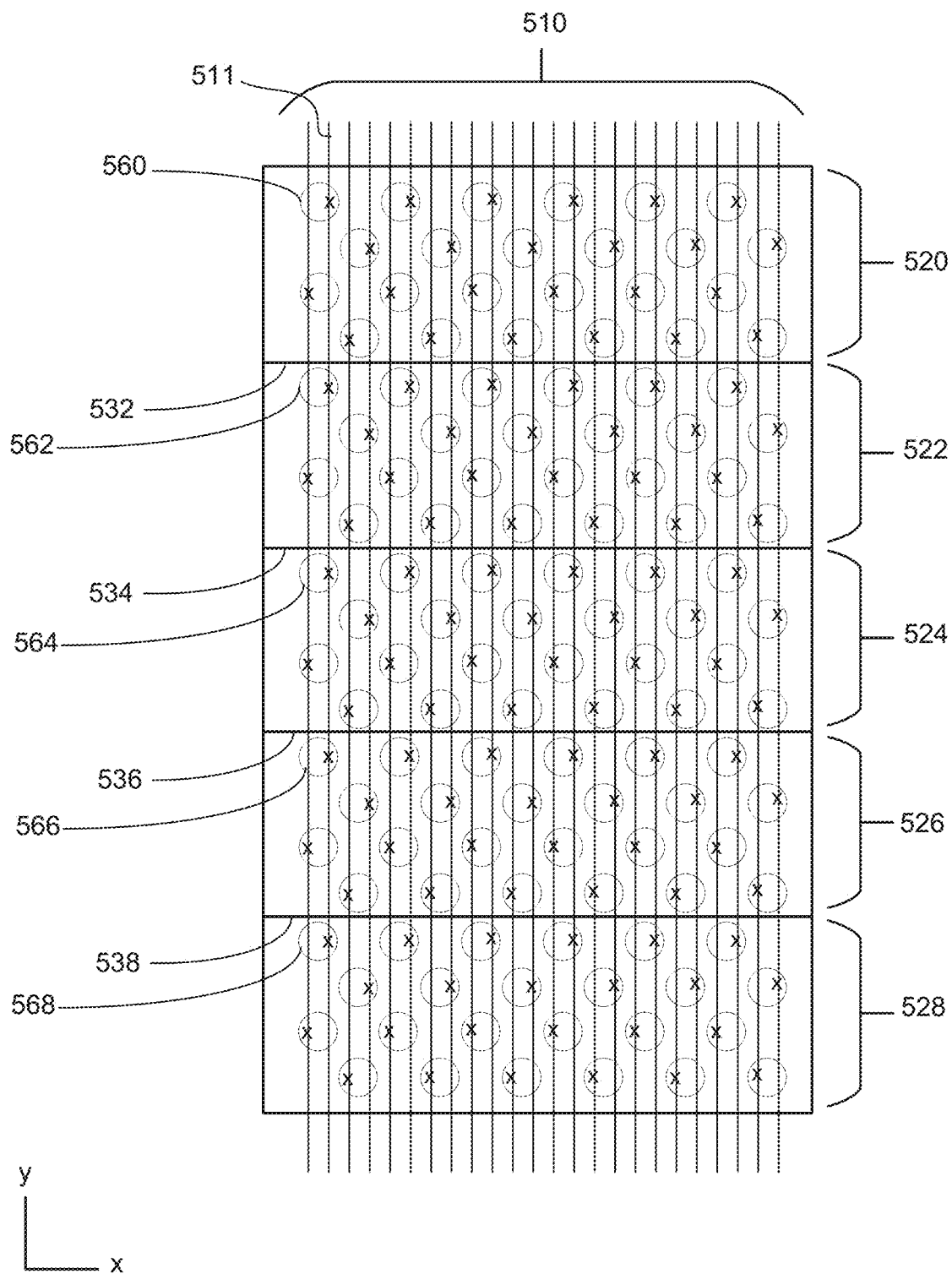
FIG. 4F depicts a top view of a portion of one embodiment of a block of memory cells.

FIG. 4F is a block diagram depicting a top view of a portion of one block from another embodiment of memory structure 202. In one embodiment, the memory structure has many layers; however, FIG. 4F only shows the top layer. The block of FIG. 4F is divided into five fingers 520, 522, 524, 526, and 528. The block depicted in FIG. 4F includes a set of dividers 532, 534, 536 and 538 that separate and electrically isolate the SDT, SGD and SGS layers, but not the data word line layers. That is, in one embodiment, the data word lines (WL0, WL1, WL95) are continuous and connected to all vertical columns (NAND strings) of the block.

FIG. 4F depicts a plurality of circles that represent the vertical columns. Each of the vertical columns include multiple select transistors and multiple memory cells. In one embodiment, each vertical column implements a NAND string. For example, FIG. 4F depicts vertical columns 560, 562, 564, 566 and 568. FIG. 4F also depicts a set of bit lines 510 (including bit line 511). Each of the circles representing vertical columns has an "x" to indicate its connection to one bit line. For example, bit line 511 is connected to vertical columns vertical columns 560, 562, 564, 566 and 568.

Figure 4G:
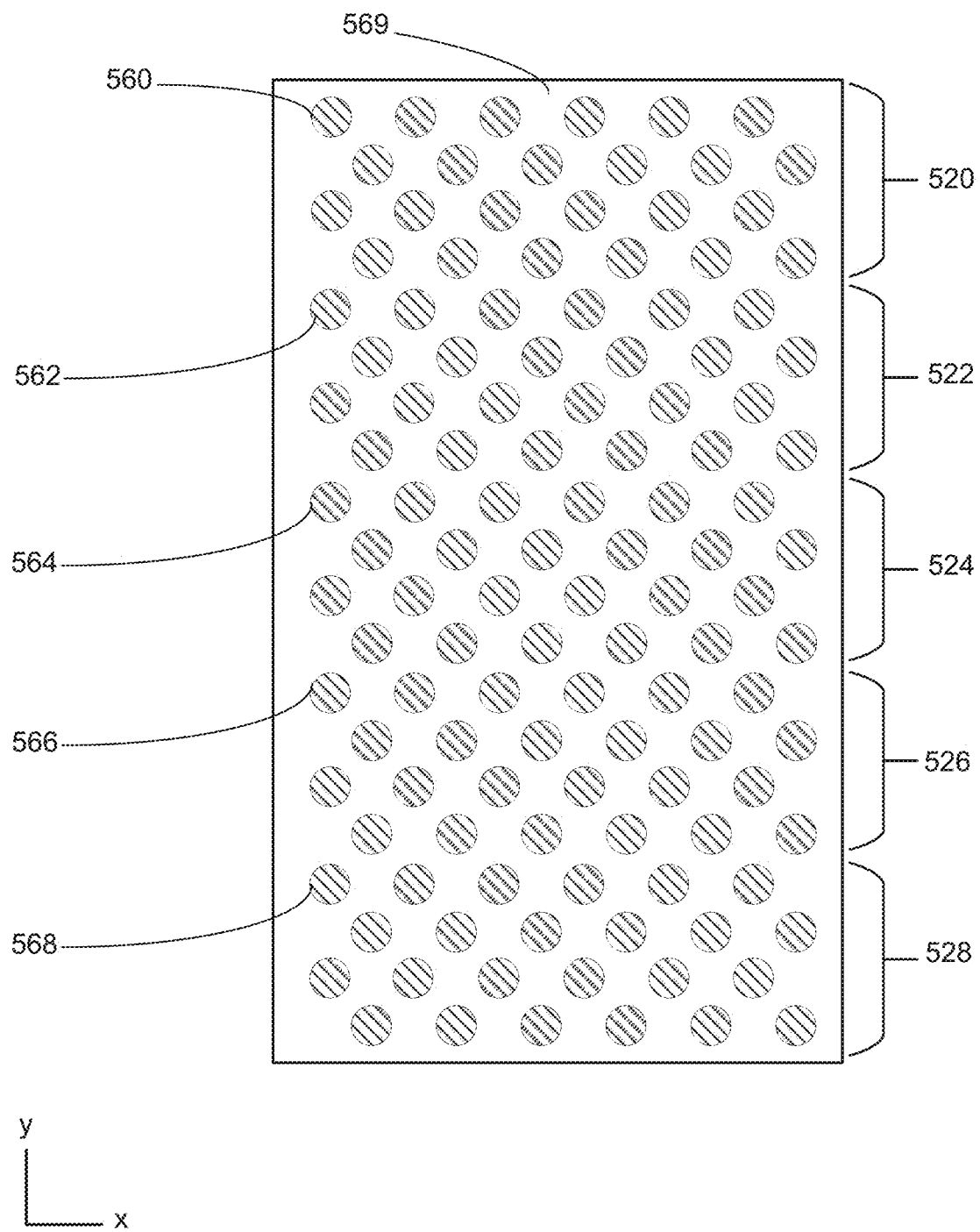
FIG. 4G depicts a top view of a portion of one embodiment of a block of memory cells.

As mentioned above, dividers 532, 534, 536 and 538 separate and electrically isolate the SDT, SGD and SGS layers, but not the data word line layers. FIG. 4G is a top view of a data word line 569 layer showing a cutaway view of the vertical columns (e.g., NAND strings) 560, 562, 564, 566 and 568. The vertical columns are depicted as shaded circle. FIG. 4G shows that although the vertical columns (e.g., NAND strings) 560, 562, 564, 566 and 568 are divided into fingers 520, 522, 524, 526, and 528, the word line layer 569 (which can be any of WL0-WL95) is continuous and connected to all vertical columns (NAND strings) of the block.

Figure 4H:
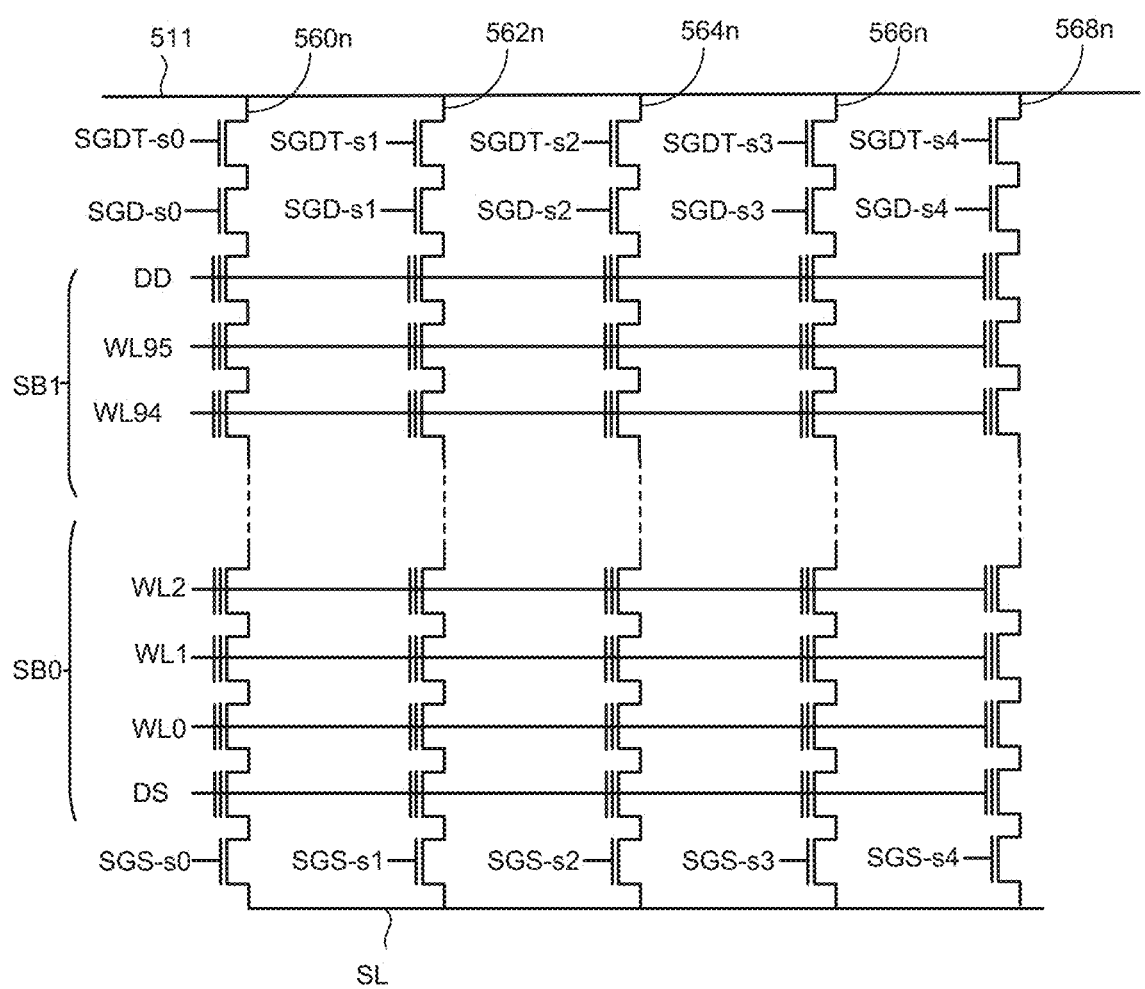
FIG. 4H is a schematic of one embodiment of a plurality of NAND strings showing multiple sub-blocks.

FIG. 4H is a schematic diagram of a portion of the memory depicted in in FIGS. 4F and 4G. FIG. 4E shows physical data word lines WL0-WL95 running across the entire block. Within the block, in one embodiment, each bit line is connected to five NAND strings. The block is divided into five fingers 520, 522, 524, 526 and 528. In one embodiment, the data word line layers of each finger are connected together. In one embodiment, the drain side select layers (SGD0, SGD1 and SGD2) are electrically divided into five separate drain side select lines and gates (transistors) SGD-s0, SGD-s1, SGD-s2, SGD-s3 and SGD-s4 such that there is one per finger so that each finger can be independently selected. Similarly, the SGT layers are divided into four separate lines and gates (transistors) SGDT-s0, SGDT-s1, SGDT-s2, SGDT-s3 and SDT-s4 such that there is one per finger so that GIDL can be generated separately and independently for each finger. The source side select layers (SGS0, SGS1 and SGS2) are electrically divided into four separate source side select lines and gates (transistors) SGS-s0, SGS-s1, SGS-s2, SGS-s3 and SGS-s3 such that there is one per finger so that each finger can be independently selected.

Finger 520 includes those vertical NAND strings controlled by SGD-s0 and SGS-s0. For example, finger 520 includes NAND string 560n which corresponds to vertical column 560. Finger 522 includes those vertical NAND strings controlled by SGD-s1 and SGS-s1. For example, finger 522 includes NAND string 562n which corresponds to vertical column 562. Finger 524 includes those vertical NAND strings controlled by SGD-s2 and SGS-s2. For example, finger 524 includes NAND string 564n which corresponds to vertical column 564. Finger 526 includes those vertical NAND strings controlled by SGD-s3 and SGS-s3. For example, finger 526 includes NAND string 566n which corresponds to vertical column 566. Finger 528 includes those vertical NAND strings controlled by SGD-s4 and SGS-s4. For example, finger 528 includes NAND string 568n which corresponds to vertical column 568.

Although the example memories of FIGS. 3-4H are three dimensional memory structure that includes vertical NAND strings with charge-trapping material, other (2D and 3D) memory structures can also be used with the technology described herein.

Figures 5, 6:
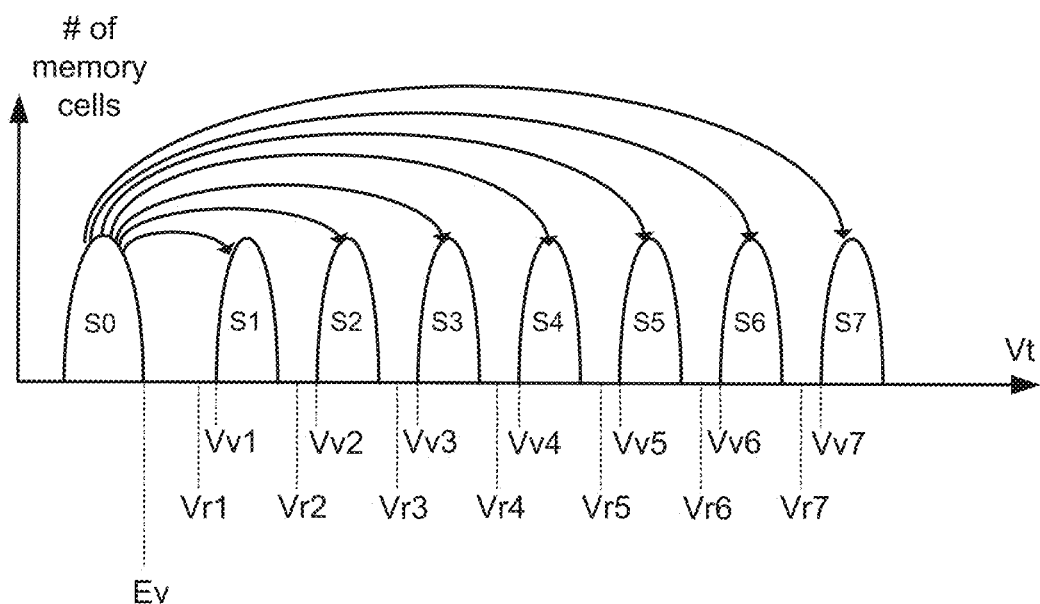
FIG. 5 depicts threshold voltage distributions.
FIG. 6 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 is a graph of threshold voltage versus number of memory cells, and illustrates example threshold voltage distributions for the memory array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. For a data state N, that data state N has higher threshold voltages than data state N−1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed states or programmed data states. In some embodiments, data states S1-S7 can overlap, with controller 120 relying on error correction to identify the correct data being stored.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming including (but not limited to) multiple stage/phase programming.

Each threshold voltage distribution (data state) of FIG. 5 corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

FIG. 6 is a table describing one example of an assignment of data values to data states. In the table of FIG. 6, S0=111 (erased state), S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 5) or verify operation (e.g. see verify reference voltages Ev, Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

Figure 7:
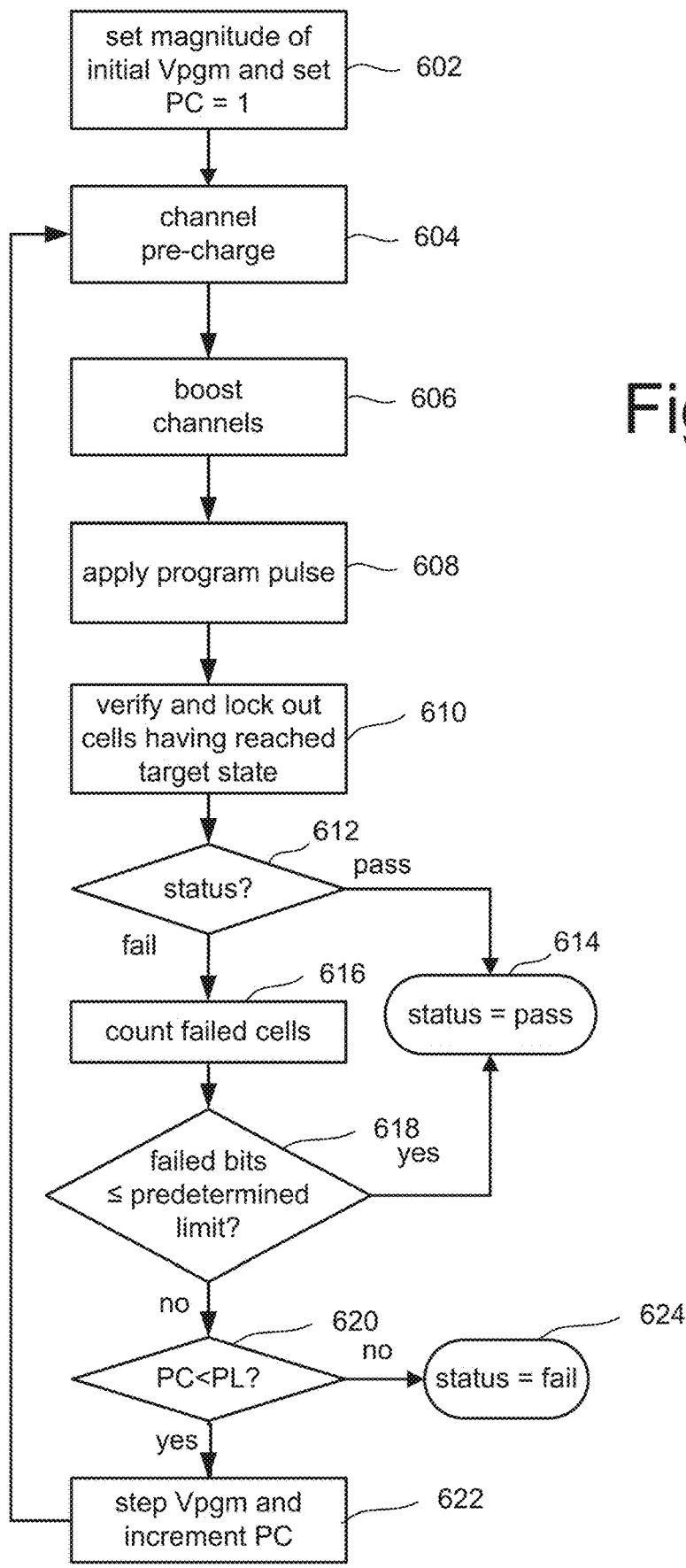
FIG. 7 is a flow chart describing one embodiment of a process for programming non-volatile memory.

FIG. 7 is a flowchart describing one embodiment of a process for programming that is performed by memory die 200 and/or integrated assembly 207. In one example embodiment, the process of FIG. 7 is performed on memory die 200 using the one or more control circuits (e.g., system control logic 260, column control circuitry 210, row control circuitry 220) discussed above. In one example embodiment, the process of FIG. 7 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 7 is performed to implement the full sequence programming, as well as other programming schemes including multi-stage programming. When implementing multi-stage programming, the process of FIG. 7 is used to implement any/each stage of the multi-stage programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 7, the program voltage (Vpgm) is initialized to the starting magnitude (e.g., ~12-20V or another suitable level) and a program counter PC maintained by state machine 262 is initialized at 1.

In one embodiment, the set of memory cells selected to be programmed (referred to herein as the selected memory cells) are programmed concurrently and are all connected to the same data word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the storage system will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected data word lines receive one or more boosting voltages (e.g., ~7-11 volts) to perform boosting schemes. A program inhibit voltage is applied to the bit lines coupled the unselected NAND string. One boosting mechanism, local self-boosting or LSB, is discussed in more detail below.

In step 608, a program pulse (e.g., voltage pulse) of the program signal Vpgm is applied to the selected word line (the data word line selected for programming). If a memory cell on a NAND string should be programmed, then the corresponding bit line is biased at a program enable voltage, in one embodiment. Herein, such a NAND string is referred to as a "selected NAND string." In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all the memory cells connected to the selected word line will concurrently have their Vt change, unless they are inhibited from programming.

In step 610, memory cells that have reached their target states are locked out from further programming. Step 610 may include performing verifying at one or more verify reference levels. In one embodiment, the verification process is performed by testing whether the threshold voltages of the memory cells selected for programming have reached the appropriate verify reference voltage.

In step 610, a memory cell may be locked out after the memory cell has been verified (by a test of the Vt) that the memory cell has reached its target state. If, in step 612, it is determined that all of the memory cells have reached their target threshold voltages (pass), the programming process is complete and successful because all selected memory cells were programmed and verified to their target states. A status of "PASS" is reported in step 614. Otherwise, if, in step 612, it is determined that not all the memory cells have reached their target threshold voltages (fail), then the programming process continues to step 616.

In step 616, the system counts the number of memory cells that have not yet reached their respective target Vt distribution. That is, the system counts the number of memory cells that have, so far, failed to reach their target state. This counting can be done by the state machine 262, the memory controller 120, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for a page (e.g., the unit of programming and the unit of reading) of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a pro-rata (or other) portion of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 1, 12, 16, 20 and 30; however, other values can be used. If the program counter PC is not less than the program limit value PL, then the program process is considered to have failed and a status of FAIL is reported in step 624. If the program counter PC is less than the program limit value PL, then the process continues at step 622 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 622, the process loops back to step 604 and another program pulse is applied to the selected word line so that another iteration (steps 604-622) of the programming process of FIG. 7 is performed.

Because it is possible that errors can occur when programming or reading, and errors can occur while storing data (e.g., due to electrons drifting, data retention issues or other phenomenon), error correction is used with the programming of data. Memory systems often use Error Correction Codes (ECC) to protect data from corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as 1/2). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, memory controller 120 receives host data (also referred to as user data or data from an entity external to the memory system), also referred to as information bits, that is to be stored non-volatile memory structure 202. The informational bits are represented by the matrix i=[1 0] (note that two bits are used for example purposes only, and many embodiments have code words longer than two bits). An error correction coding process (such as any of the processes mentioned above or below) is implemented by ECC engine 158 of memory controller 120 in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes are typically applied (e.g., by ECC engine 158) to multiple pages encoded across a number of memory cells, but they do not need to be applied across multiple pages. The data bits can be mapped to a logical page and stored in memory structure 202 by programming one or more memory cells to one or more programming states, which corresponds to v.

In one embodiment, programming serves to raise the threshold voltage of the memory cells to one of the programmed data states S1-S7, and erasing serves to lower the threshold voltage of the memory cells to the Erase data state S0.

When programming the memory cells as described above, prior to applying a program pulse at step 608 of FIG. 7, if a memory cell should be programmed, then the corresponding bit line is grounded, or, more generally, set to a program enable voltage. On the other hand, if the memory cell should remain at its current threshold voltage, then the corresponding bit line is connected to a program inhibit level, such as Vdd. In many embodiments, the word lines of an erased block are programmed stating at the source end with word line word line WL0 of FIG. 4A-4H. As the other memory cells of the columns between the selected word line and the bit line are erased, this allows for the level on the bit line to be applied to the memory cells of the selected word line uniformly, whereas if any of the intermediate memory cells were programmed, this pre-charging of the memory cells could be blocked. The word lines of the block are then sequentially written in an order working from the source side on the bottom towards the bit lines at the drain end of the NAND strings. This is illustrated schematically in FIG. 8A.

Figure 8A:
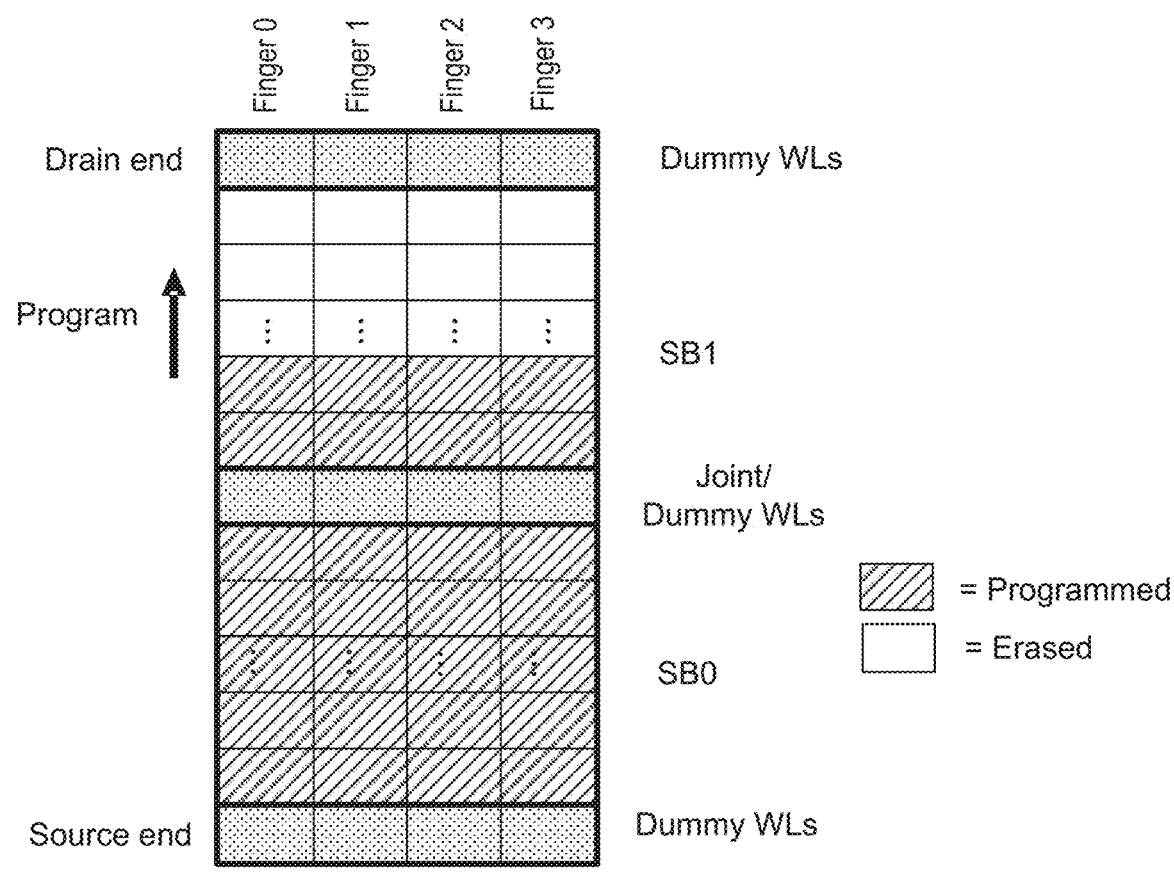
FIGS. 8A and 8B depict examples of word line programming orders for a two sub-block, upper sub-block/lower sub-block embodiment.

FIG. 8A is a simplified version of FIGS. 4A-4H describing one embodiment of a process for programming word lines of a block of memory cells sequentially from the source end (at bottom) towards the drain end in "normal order programming", or NOP. The block is shown at a stage where the lower sub-block SB0 is programmed and the first few word lines of the upper sub-block SB1 have been written. The stippled regions at top represent the select gates and any dummy word lines at the ends of the strings through which the NAND strings are respectively connected to the bit and source lines on either end. The central stippled region represents any dummy word lines in the joint region between sub-blocks SB1 and SB2, such as WLDL and WLDU of FIG. 4C, as well as any joint transistors between the sub-blocks, if these are included in the structure. In many embodiments, the dummy word lines at the source and drain ends, as well the inter-sub-block dummy word lines, if included, are not rewritten in a standard programming operation.

In embodiments where the memory system allows program and erase at the sub-block level, the state of one sub-block can affect the operation of the other sub-block. Whether or not the lower sub-block SB0 is programmed, the standard programming order illustrated in FIG. 8A can be used on upper sub-block S1 as the lower sub-block SB0 is not between the bit lines and the selected word line. Similarly, if the upper sub-block SB1 is erased, as after a full physical block erase, normal order programming can be used for the lower sub-block SB0. However, in the case where the upper sub-block SB1 is programmed, but the lower sub-block SB0 has been erased and is to be programmed, the programming order can be altered in some embodiments.

Figure 8B:
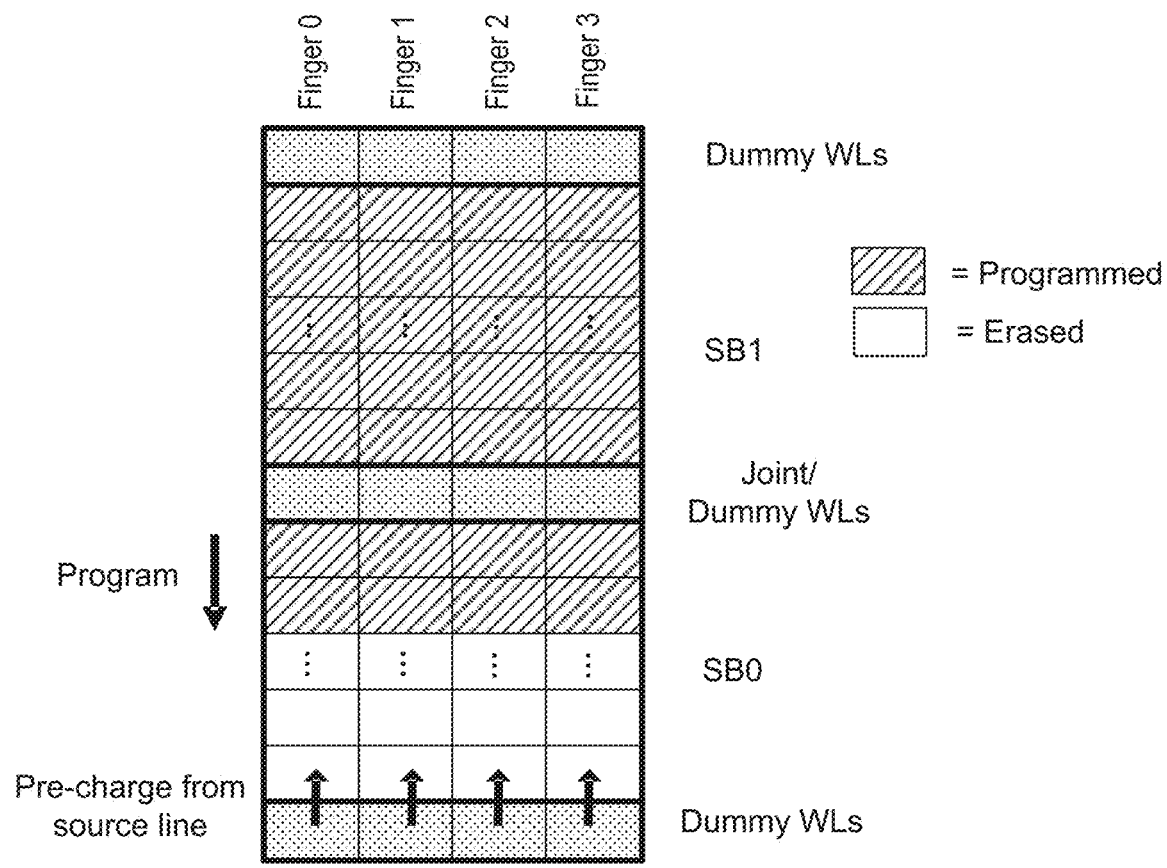

FIG. 8B illustrates the case where the upper sub-block SB1 is programmed, and the lower sub-block is to be programmed. Normal order programming (programming up from the source side) for the lower sub-block SB0 creates problems when the upper sub-block SB1 is programmed as the pre-charge from the bit line side can be obstructed. The conventional order can also lead to other problems, such as program disturb concerns for the data programmed in the upper sub-block SB1. To help alleviate these problems, FIG. 8B illustrates an embodiment that uses a "mirror" or reverse order of programming (ROP), where the word lines of the lower sub-block SB0 are programmed sequentially from the middle downwards. In some embodiments, columns can be pre-charged form the source line, rather than the bit line, to either a program inhibit or program enable level, avoiding the problems that can arise when pre-charging from the top side when the upper sub-block SB1 is programmed.

Referring back to FIG. 7, at step 606 the programming process boosts the channel along the NAND strings. One technique used for this be the local self-boosting, or LSB, scheme that is used to improve the isolation of the channel areas coupled to a selected word line and reduce program disturb levels on neighboring NAND strings. The LSB scheme can be illustrated with reference to FIG. 9.

Figure 9:
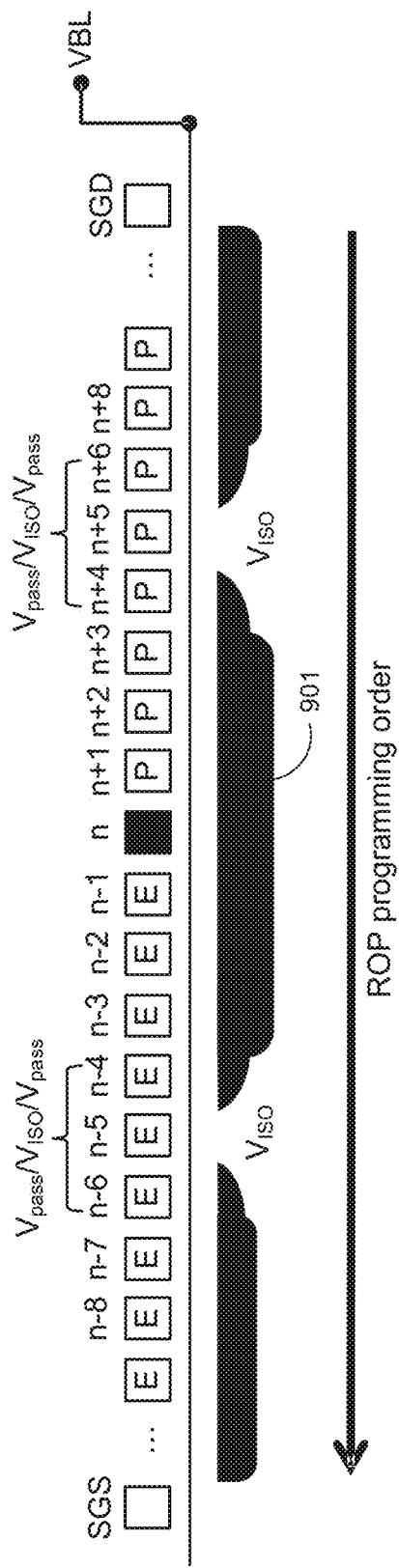
FIG. 9 illustrates a NAND string channel structure during local self-boosting.

FIG. 9 illustrates a NAND string channel structure during local self-boosting. In the schematic representation of FIG. 9, the NAND string is shown running horizontally for convenience of representation, but the NAND string can either part of a 2D structure (as is normally represented this way) or can correspond to a vertical NAND string as described with respect to FIGS. 3-4H, which is embodiment primarily being discussed here. The word lines and select gates are represented as squares and are oriented to be running into the page. The selected word line is in black is at n, with eight word lines to either side also labelled relative to word line n, and the channel region under the selected memory cell and extending to the isolation region to either side is indicated at 901. In the case of reverse order programming, word lines on the source side of the selected word line (i.e., n−1, n−2, . . . ) have not yet been programmed are in an erased state, as indicated by the "E", and word lines on the drain side of the selected word line (i.e., n+1, n+2, . . . ) already been programmed, as indicated by the "P". The size of the channel region below the word lines when using the local self-boosting scheme is represented in black.

In the local self-boosting scheme, when applying a high programming voltage to the selected word line n, in order to reduce or prevent program disturb in a memory cell on word line n in a NAND string that is program inhibited, a low isolation voltage $V_{ISO}$ is applied to a word line to either side of word line n, rather than apply the pass voltage $V_{pass}$ that is otherwise used for non-selected word lines. In the example illustrated in FIG. 9, word line n−5 and word line n+5 are biased at $V_{ISO}$, but other embodiments can use a word line nearer or further from the selected word line. When biased at $V_{ISO}$, the memory cells along word lines n−5 and n+5 are turned off, but the channel potential of the memory cells along the selected word line n are not, or at least less, influenced by the self-boosting in the channel regions of memory cells along word lines n−5 and n+5. Therefore, the channel potential of the channel region of a memory cell along word line n can be raised by the high programming voltage Vpgm to a voltage level that is higher than that which would be achieved were the channel region 901 of a memory cell word line n influenced by the self-boosting of memory cells along word lines n−5 and n+5. This prevents program disturb in a memory cell in a program inhibited NAND string along word line n that is adjacent to memory cell on a program enabled NAND string along word line n. With respect the non-selected word lines not biased to $V_{ISO}$, depending on the embodiment, these can also use the same $V_{pass}$ level, or different $V_{pass}$ levels can be used, such as a somewhat lower $V_{pass}$ for the word lines adjacent to those biased at $V_{ISO}$ (e.g., n−6, n−4), a somewhat higher $V_{pass}$ for word lines near the selected word line (e.g., n−1, n−2), or some combination of these.

FIG. 9 illustrates local self-boosting being applied using reverse order programming. When programming using reverse order programming in the lower sub-block SB0 as illustrated in FIG. 8B, this can lead to complications in the programming of selected NAND strings. In one set of embodiments, normal order can be used for all sub-blocks; however, this may result in the lessening of the pre-charge benefit in boosting the lower sub-block. The following presents techniques for use of local self-boosting combined with reverse order programming. The discussion is presented in the context of two sub-blocks (an upper sub-block and a lower sub-block), but can be extended to three or more such sub-blocks, such as an upper, a middle, and a lower sub-block arrangement where, referring to FIG. 4C, above WL95 could be another joint with dummy word lines on either side and another set of word lines above.

Still referring to FIG. 9, there is a high chance that the word line n+5 biased to $V_{ISO}$ will cut off the channel on a selected NAND string so that the channel cannot be placed into a programming enabled level when using reverse order programming. This is also true of word lines n+4 and n+6 if these are using a lower than standard pass voltage. Because of this, during reverse order programming, even if the corresponding bit line is set to program enable voltage (e.g., $V_{BL}$=0V), the channel may still be boosted due to $V_{ISO}$ being applied on word line (in this embodiment) n+5.

In more detail, since the lower sub-block is cut off from both drain and source sides during local self-boosting, the memory device has to ensure that the channel for a program selected memory cell is set to be at a low voltage, such as ground. Failure of delivering a program enable voltage or partially program inhibited voltage (such as used in quick pass write embodiments) will boost the selected channel and program will be very slow, resulting in an abnormally high loop count for the programming algorithm. When using a normal order programming, this is not such an issue as a minimum $V_{ISO}$=0 can turn off the erased states anyway on the drain side. However, in the reverse order program case, since the physical drain side cells are already programmed, it is highly likely that the application of $V_{ISO}$ at (physical) drain side will cut off word line n+5, where something similar can happen on word line n+4 and word line n+6 is their threshold voltage is higher. Consequently, in the reverse order program case, the memory system may not be able to ground (or, more generally, set to a program enable voltage) the channel of a selected NAND string as needed.

To address this concern, the following discussion presents an approach in which the dummy word lines to either side of the joint region (WLDL, WLDU in FIG. 4C) are used as select gates for a sub-block based local self-boosting scheme. In additional to using one or both of the joint region dummy word lines (or WLDJ, which can be either or the combination of WLDL and WLDU), the unselected sub-block is boosted first to pre-charge the selected sub-block in the programming process. Aspects of this approach can be described with respect to FIG. 10.

Figure 10:
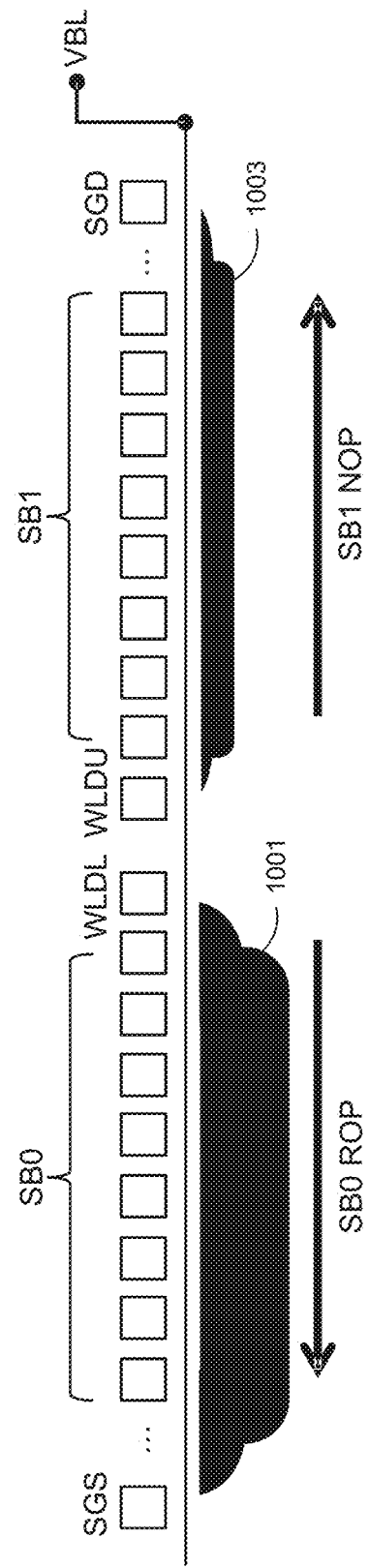
FIG. 10 is a schematic representation of a NAND string's word lines and channel depths in the joint region of a two sub-block embodiment to illustrate sub-block based boosting.

FIG. 10 is a schematic representation of a NAND string's word lines and channel depths in the joint region of a two sub-block embodiment. FIG. 10 illustrates a number of word lines between a source side select gate SGS and a drain side select gate SGD and an underlying channel region represented as in FIG. 9, focusing on the joint region. In the lower sub-block SB1, the joint region dummy word line WLDL and the next several word lines in the source direction are explicitly represented, and, in the upper sub-block SB0, the joint region dummy word line WLDU and the next several word lines in the drain direction are explicitly represented. In the embodiment illustrated in FIG. 10, the lower sub-block SB0 uses reverse order programming and the upper sub-block SB1 uses normal order programming, but boosting is now based on the whole of the sub-block being boosted, with the joint area dummy word lines used to cut off the channel region between the channel region 1001 of selected sub-block SB0 and the channel region 1003 of unselected sub-block SB1.

The channel depths illustrate the case when the lower block SB0 is selected for programming and the upper sub-block SB1 is unselected. At the joint region, the dummy word lines WLDL and WLDU are biased at a lower voltage to serve as a boundary to cut-off SB0 from SB1. A relatively high $V_{pass}$ value, $V_{pass\_select\_SB}$ is used on non-selected word lines for the selected (in this example) sub-block SB0 for better boosting, as illustrated by the deeper channel depth. For the unselected upper sub-block SB1, a lower $V_{pass}$ value, $V_{pass\_select\_SB} < V_{pass\_select\_SB}$ is used for lower disturb, but where $V_{pass\_select\_SB}$ is sufficiently high to boost SB1 channels so that they can serve a channel pre-charge purpose.

The following discussion further develops this concept of a sub-block based mode of channel boosting, where the joint region dummy word lines WLDL, WLDU are used as select gates that cut-off the channel for an inhibited bit line, but allow transfer of a program enable voltage (e.g., Vss, or 0 V) to the channel of selected bit lines for the selected sub-block. For embodiments that use a quick pass write mechanism, in which memory cells that are close to their target state have their program rate slowed by partially inhibiting the effects of subsequent programming pulses, the joint region dummy word lines WLDL, WLDU should also allow transfer of the corresponding quick pass write bit line bias level to the channel of selected bit lines for the selected sub-block. The use of different voltages for the selected and unselected sub-blocks will boost to different channel potential levels, so that a selected sub-block boosts to higher level for better programming while an unselected sub-block boosts to a lower level to reduce $V_{pass}$ related disturb. In some embodiments, a technique is presented to pre-charge a selected sub-block by boosting of the unselected sub-block first. In some embodiments, the $V_{pass}$ level for unselected sub-blocks can be an adaptive setting depending on how many word lines of the unselected sub-block are programmed, where the word lines that are programmed, the lower $V_{pass}$ that is required.

The joint region dummy word lines should have a well-controlled threshold voltage so that their voltage margins are sufficient to accommodate both inhibiting and selecting bit lines, similar to the drain side select gate on the NAND strings. For embodiments using quick pass write, the margin will also need to pass the quick pass write bit line voltage. In some embodiments, additional word lines adjacent to the dummy word lines WLDL and WLDU can also be used to cut-off the channel between sub-blocks if a single dummy word line to either side is sufficient. These and other factors related to sub-block based self-boosting are discussed with reference to FIG. 11.

FIG. 11 is a schematic representation of a two sub-block embodiment of a partially programmed NAND string that is being written in reverse order program to illustrate the relation of elements involved in sub-block based self-boosting. FIG. 11 is arranged and notated similarly to FIG. 9, but without a particular biasing and corresponding channel state represented, and illustrates the function of the pre-charge/boosting process further. When the NAND string is to be program inhibited, the bit line voltage VBL is set to a relatively high voltage, such as Vdd or other elevated voltage, such as the highest voltage available from the corresponding sense amplified of VDDSA. When the NAND string is to be program enabled (i.e., to be programmed), the bit line voltage is set to VBL=0 V (=Vss) or other low voltage. For embodiments using the quick pass write mechanism, VBL can also a corresponding low, but higher than program enable, value to slow but not fully inhibit programming.

Looking at the margin for the joint region dummy word lines, referring to both of WLDU and WLDL as WLDJ, to pass the program enable voltage of Vss, the voltage applied to WLDJ, V_WLDJ, needs to satisfy V_WLDJ−Vt>Vss, where Vt is the threshold voltage of the WLDJ transistor. To be able to cut-off the program inhibit voltage of VDDSA, the WLDJ bias has to satisfy V_WLDJ−Vt≤VDDSA. Consequently, the margin for (V_WLDJ−Vt) will be in the range (Vss, VDDSA), so that, as long as the width of the Vt distribution is in this range, there will be a usable V_WLDJ margin. (In embodiments using quick pass write, Vss would be replaced with the quick pass write word line bias level for NAND string to be partially inhibited.) For example, if Vss=0 and VDDSA=2V, then in the worst case the WLDJ Vt distribution cannot be wider than 2V. (In this discussion, all of the voltage levels are reference to a source line voltage of 0 V.)

In order to pass VDDSA, an unselected SB has to be biased with a pass voltage Vpass greater than or equal to VDDSA plus any transistor threshold voltage along the way. In real operation, to reduce disturbs and save power the corresponding Vpass level should be as low as practical. This restricts the highest VDDSA as a lower VDDSA is preferable, but it still needs to be able cut off WLDJ when needed. Consequently, the choice of the VDDSA values is a design decision to balance these concerns.

Figure 12B:
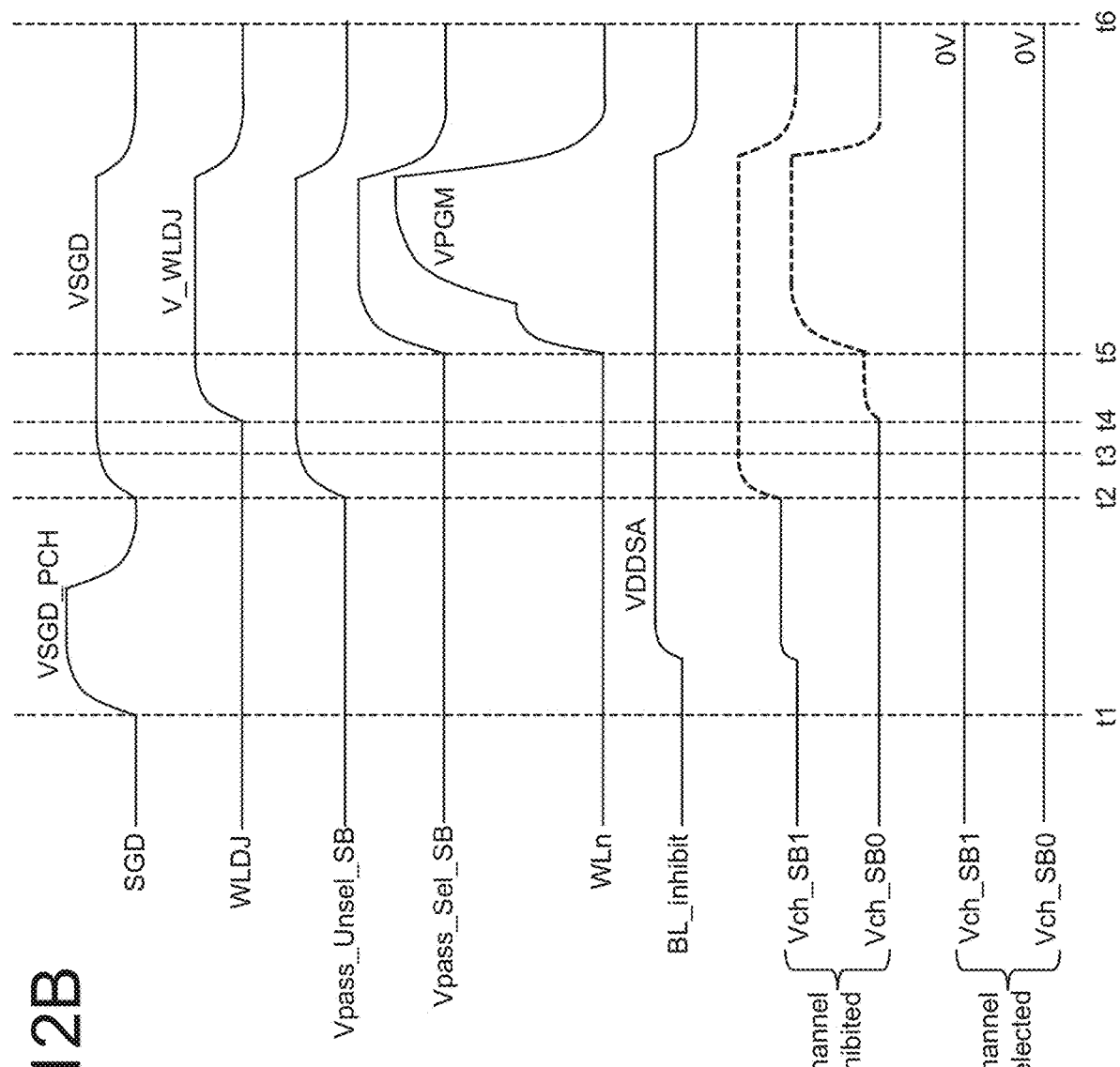
Figure 13B:
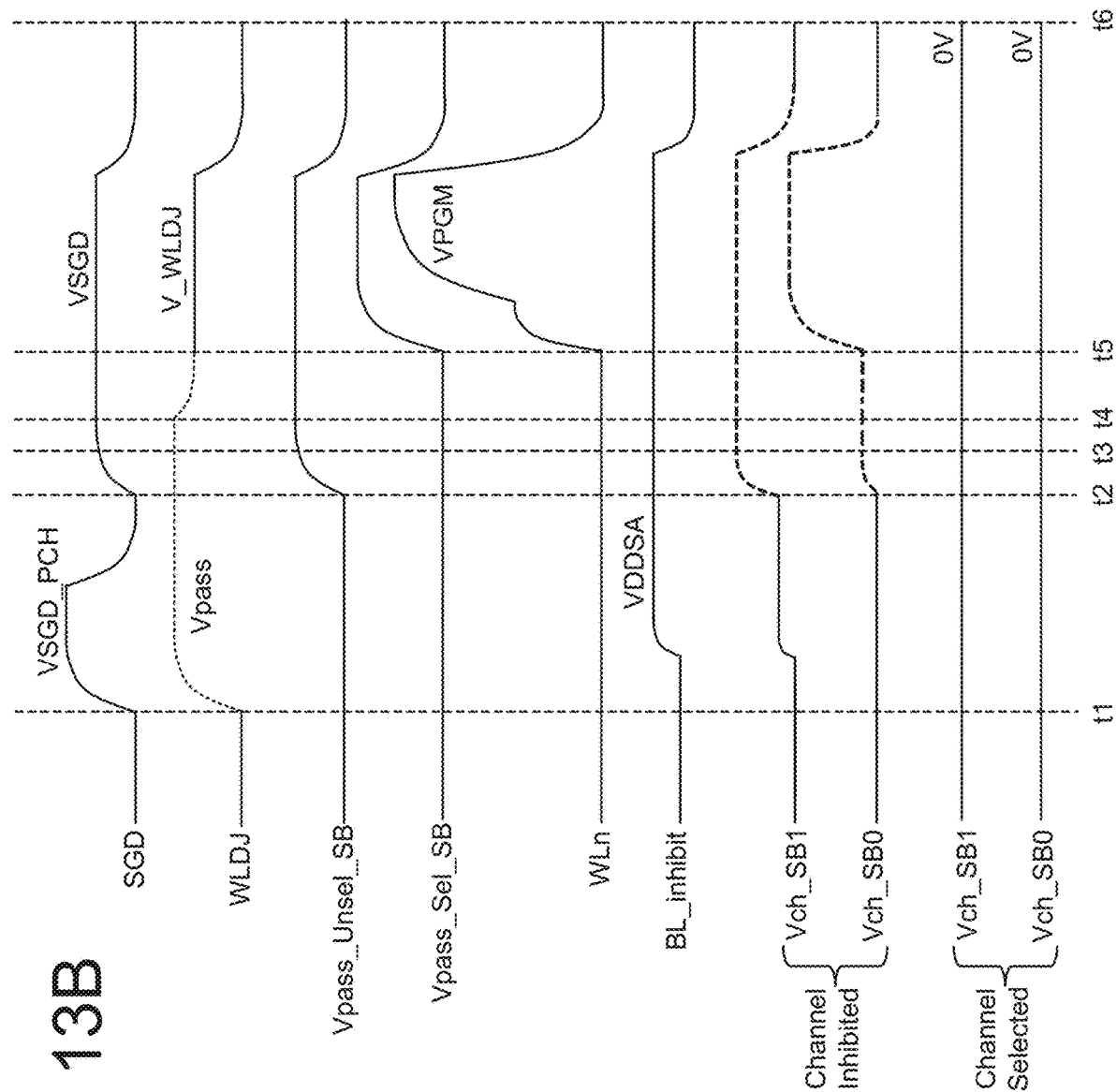
Figure 14B:
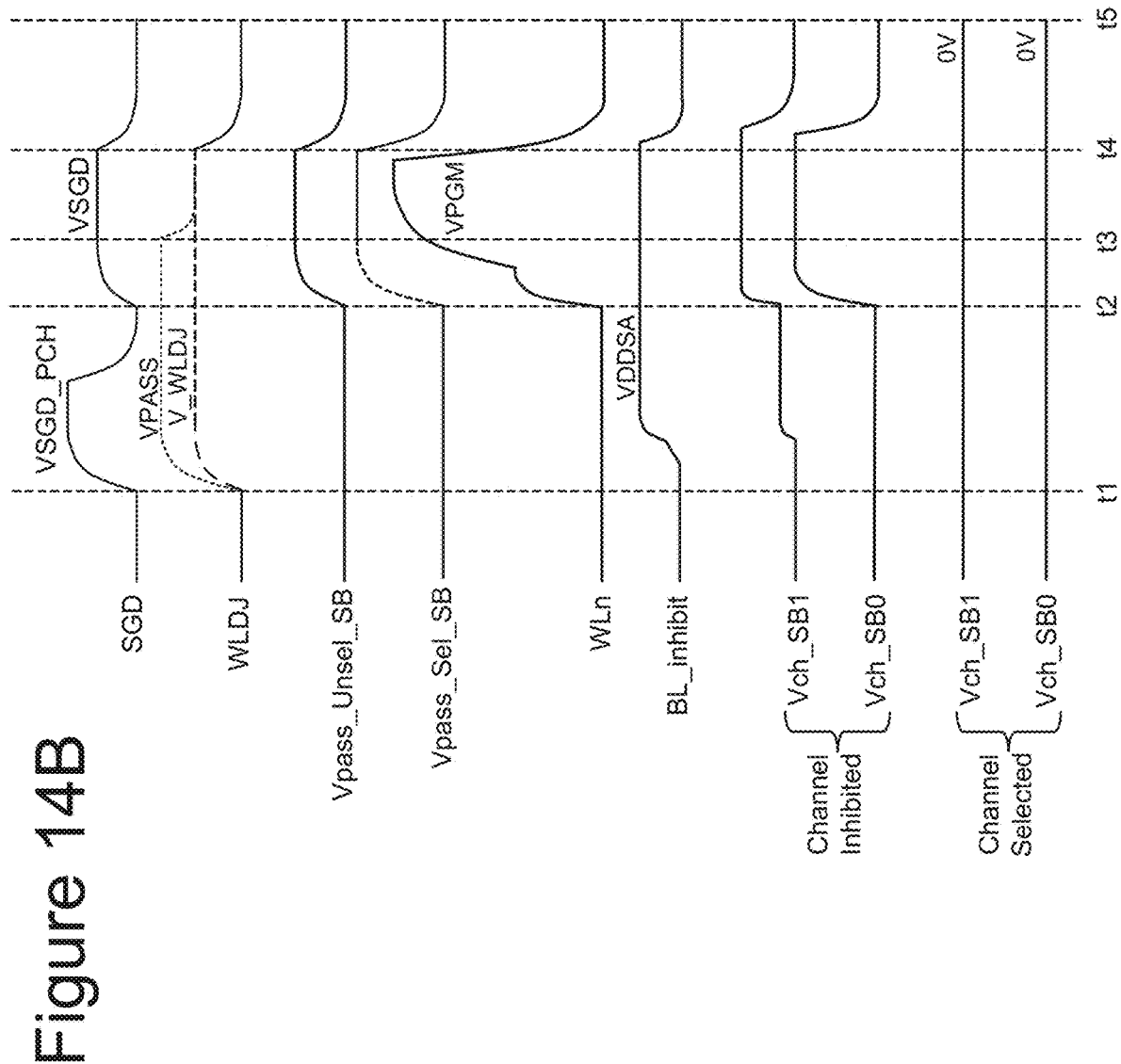

FIGS. 12A, 12B, FIGS. 13A, 13B, and FIGS. 14A, 14B present embodiments of sub-block based self-boosting schemes. FIGS. 12A, 13A, and 14A are a high level flow of a sub-block based channel boost process, and FIGS. 12B, 13B, and 14B are corresponding sets of waveforms. More specifically, FIGS. 12A and 12B present a two stage sub-block based boosting scheme; FIGS. 13A and 13B present a variation on the embodiment of FIGS. 12A and 12B; and FIGS. 14A and 14B present a single stage sub-block based boosting scheme. In each of these pairs of figures, the flow chart is meant to highlight features that are developed in more detail in the corresponding set of waveforms.

FIGS. 12A and 12B present a two-stage sub-block based boosting scheme for the example where the lower sub-block SB0 is the selected to undergo programming using reverse order programming, where FIG. 12A highlights some of the features discussed in more detail with respect to the waveforms of FIG. 12B. Starting at step 1201, the joint region dummy word lines WLDJ (i.e., WLDU/WLDL) are biased to be off. With WLDJ off, at step 1203 a pass voltage applied to the non-selected sub-block (here SB1) VPASS_Unsel_SB ramps up to boost the channel in SB1 to ~VDDSA. At step 1205, the voltage V_WLDJ applied to the joint region dummy word lines WLDJ ramps to V_WLDJ=~VDDSA, so that WLDJ will be on for selected bit lines biased to the program enable level of 0 V, but will stay off for unselected bit lines biased to the program inhibit voltage VDDSA. After ramping up the voltage on WLDJ, the pass voltage applied to the selected sub-block (here SB0) VPASS_Sel_SB ramps up at step 1207, where in this embodiment VPASS_Sel_SB>VPASS_Unsel_SB. This arrangement allows for the sub-block SB1 side channel to have a higher pre-charge level than for the SB0 side, so that the WLDJ transistors are cut-off and the SB0 can be boosted. More specifically, by boosting the SB1 channel to ≥VDDSA, the SB0 drain side (WLDJ) will be cut off for SB0 boosting.

FIG. 12B illustrates a set of waveforms for an embodiment of a programming operation including the elements presented in the flow of FIG. 12A. Prior to t1, all of the waveforms are at ground. At t1, the drain side select gate can be taken to a pre-charge level VSGD_PCH for the first part of the interval and the bit lines pre-charged, where, if the bit line is to be inhibited, its voltage is raised to the VDDSA as illustrated in the BL_inhibit waveform. The waveform for the case of a bit line to programmed is not shown in FIG. 12B, but will stay at ground during the process; and for the case of a quick pass write (also not shown), the waveform would be similar to BL_inhibit, but being of a lower amplitude somewhat above ground but less than VDDSA. As WLDJ is still at ground, the result is that for an inhibited bit line the SB1 channel will be raised, while the SB0 channel remains at ground. For a selected bit line, both the SB0 and SB1 stay at ground and will remain at ground for the rest of the process. At t2, the pass voltage Vpass_Unsel_SB applied to the word lines of the unselected sub-block ramps up, corresponding to step 1203, along with the drain side select gate being turned on by being biased to VSGD. As WLDJ is still turned off, the channel voltage on SB1 is further raised by the application of Vpass_Unsel_SB, so that during the interval t3-t4, if the NAND string is to be inhibited, the SB1 channel is boosted and SB0 channel is still at 0 V. To improve margin, the bias level on WLDJ is not raised to V_WLDJ until t4, so that the levels can stabilize during the interval t3-t4. The duration of the intervals t2-t3, t3-t4, and t4-t5 related to the ramp up of WLDJ and the selected Vpass level can be settable parameters in some embodiments.

Concerning the amplitude of Vpass_Unsel_SB, the level on the boosted SB1 channel will determine the V_WLDJ margin, where the higher the SB1 channel potential, the wider the V_WLDJ margin. As the channel potential depends on whether SB1 is erased, partially programmed, or fully programmed, in some embodiments Vpass_Unsel_SB could be set to different values, including a lower value if SB1 is erased, an intermediate value if SB1 is partially programmed, and a higher value if SB1 is fully programmed, where the program state of SB1 could be maintained by the system in a register, for example.

At t4, and corresponding to step 1205, WLDJ is raised to V_WLDJ, which also brings up the SB0 channel and inhibit programming along unselected NAND string. Consequently, by t5 the memory array has been biased to be ready for the application of the word line voltage to the selected subblock. Corresponding to step 1207, at t5 the non-selected word lines of SB0 are biased at Vpass_Sel_SB, pulling up the SB0 channel as they ramp up, where Vpass_Sel_SB>Vpass_Unsel_SB. At t5 the selected word line WLn also receives the programming pulse corresponding to loop of the programming process, initial ramping up along with the Vpass_Sel_SB and continuing to the VPGM level. Following the program pulse, all of the levels can go back to ground before repeating the process for subsequent programming pulses, if any, after t6.

Depending on the embodiment, in the arrangement of FIG. 12B, the SB0 channel can be pre-charged in reverse order programming from the source side or, if operated in normal order programming, pre-charged from the SB1 boosting. For SB1 channel pre-charge, in reverse order programming, the pre-charge can be from SB0 boosting; and in normal order programming, the pre-charge can the standard bit line, drain side select gate pre-charge mechanism. Considering the Vch_SB0 level for the inhibited case during the interval t4-t5, at this point WLDJ is on, so that for so that electrons leak from SB0 to SB1, which is essentially a SB0 channel potential pre-charge process. This SB0 channel pre-charge helps to establish the final boosted level in the normal order program case, while in the reverse order program case this can be accomplished by source side pre-charging. Consequently, in either order of programming, SB0 will have its channel pre-charged between t4 and t5, and then boosted from this pre-charge level at t5.

FIGS. 13A and 13B present another embodiment for a two-stage sub-block based boosting scheme for the example where the lower sub-block SB0 is the selected to undergo programming using reverse order programming. FIG. 13A highlights some of the features discussed in more detail with respect to the waveforms of FIG. 13B. Relative to FIG. 12A, rather than starting with WLDJ off, at step 1301, FIG. 13A sets WLDJ to a pass voltage, so that the joint region dummy word lines on are on. At step 1303 the pass voltage VPASS_Unsel_SB applied to the non-selected sub-block (here SB1) ramps up, resulting in the SB1 channel being boosted and, since the joint area dummy word lines are on, the potential is shared to whole channel of the NAND string (SB0 and SB1), which is equivalent to a pre-charge for SB0. Relative to the embodiment of FIGS. 12A and 12B, this allows for an earlier pre-charge of the SB0 channel. At step 1305, the voltage applied to joint region dummy word lines WLDJ ramps down to V_WLDJ=~VDDSA (as opposed to ramping up in step 1205), so that WLDJ will be on for selected bit lines biased to the program enable level of 0 V, but will stay off for unselected bit lines biased to the program inhibit voltage VDDSA. After ramping down the voltage on WLDJ, the pass voltage applied to the selected sub-block (here SB0) VPASS_Sel_SB ramps up at step 1307, where in this embodiment VPASS_Sel_SB>VPASS_Unsel_SB. This arrangement allows for the sub-block SB1 side channel to have a higher pre-charge level than for the SB0 side, so that the WLDJ transistors are cut-off and the SB0 can be boosted. More specifically, by boosting the SB1 channel to ≥VDDSA, the SB0 drain side (WLDJ) will be cut off for SB0 boosting.

The waveforms of FIG. 13B are mostly the same as discussed above with respect to FIG. 12B, but with changes to reflect the differences between FIGS. 12A and 13A. More specifically, relative to FIG. 12B, in FIG. 13B WLDJ is now raised at t1 to a pass voltage, before dropping down to V_WLDJ at t4. Aside from the SB0 channel level for the inhibited case, the other waveforms are largely the same as in FIG. 12B. For the SB1 channel of a program inhibited NAND string, the SB1 channel is pre-charged at t2 instead of t4. Relative to the embodiment of FIGS. 12A and 12B, the embodiment of FIGS. 13A and 13B allows for the SB0 channel to be pre-charged to a certain level, but can result in a narrower WLDJ margin as the SB1 channel potential is lower since SB1 has to boost both of SB0 and SB1.

FIGS. 14A and 14B present another embodiment for a single stage sub-block based boosting scheme for the example where the lower sub-block SB0 is the selected to undergo programming using reverse order programming. FIG. 14A highlights some of the features discussed in more detail with respect to the waveforms of FIG. 14B. In the single stage embodiments, the Vpass voltages for both the selected sub-block and the unselected sub-block ramp up at the same time, rather than having the offset illustrated in FIGS. 12B and 13B. In the flow of FIG. 14A, at step 1401 WLDJ is ramped up to a voltage V_DJ, where V_DJ is greater than the threshold voltage of the threshold voltage of the joint region dummy word lines WLDJ. Depending on the embodiment, the V_DJ value can be the V_WLDJ value of FIGS. 12B and 13B, or, similarly to FIG. 13B, V_DJ can initially ramp up to a pass voltage and the drop down to V_WLDJ. The pass voltage for both of SB0 and SB1 ramp up at 1403 to boost the SB0 and SB1 channels simultaneously. This will raise the SB1 channel potential to a proper WLDU level (i.e., Vch+Vt>V_DJ) and cut off the joint region. Once cut off, the SB0 channel can then be boosted higher as the SB0 and SB1 channel potential are independent at this point.

FIG. 14B is a set of waveforms for a single stage embodiment of sub-block based self-boosting. During the interval t1-t2, aside from WLDJ, the waveforms of FIG. 14B are the same as for FIGS. 12B and 13B. With respect to WLDJ, depending on the embodiment this can either ramp up to a Vpass voltage as in FIG. 13B or ramp up to V_WLDJ, corresponding to step 1401 of FIG. 14A. As in FIGS. 12B and 13B, for a program inhibited NAND string this raises the SB1 channel while that of SB0 stays at ground. At t2, the drain side select gate is enabled by ramping it to the voltage of VSGD and the word lines of the unselected sub-block are ramped up to VPASS_Unsel_SB. Unlike the two-stage embodiments of FIGS. 12A, 12B and 13A, 13B, at t2 the unselected word lines of the selected sub-block (here SB0) are ramped up to VPASS_Sel_SB. Consequently, the channels of both of SB0 and SB1 are boosted for NAND strings that are not to be programmed, inhibiting programming. At t3, for embodiments in which WLDJ was raised to a pass voltage, the bias level on WLDJ is ramped down to V_WLDJ, similar to the case of FIG. 13B at t4. The selected word line WLn of the selected sub-block ramps up between t2 and t3 to Vpass_Sel_SB and, during t3-t4, then continues on to the program pulse corresponding to the current programming loop, inducing programming in the selected memory cell of a selected NAND string. At t4, all of the waveforms return to ground and, at t5, the system is ready for a subsequent programming pulse or other operation. The arrangement of FIGS. 14A and 14B can have the relative advantages of a wide margin for joint region dummy word lines operation as select gates, as the unselected SB1 channel potential is higher, and can be somewhat faster, as there is not 2-stage boosting.

With respect to the bias levels applied to generate the waveforms of FIGS. 12A, 13A, and 14A, referring back to examples of FIGS. 2A and 2B, for the control lines for the select gates (including SGD) and word lines (WLDJ, Vpass_Unsel_SB, Vpass_Sel_SB, WLn), the bias levels can be applied from the array drivers 224 of the row control circuitry 220. The bit lines' biases can be applied by driver circuits 214 and sense amp(s) 230 of the column control circuitry. The control circuits for these processes can include elements of the system control logic 260, including the state machine 260.

Figure 15:
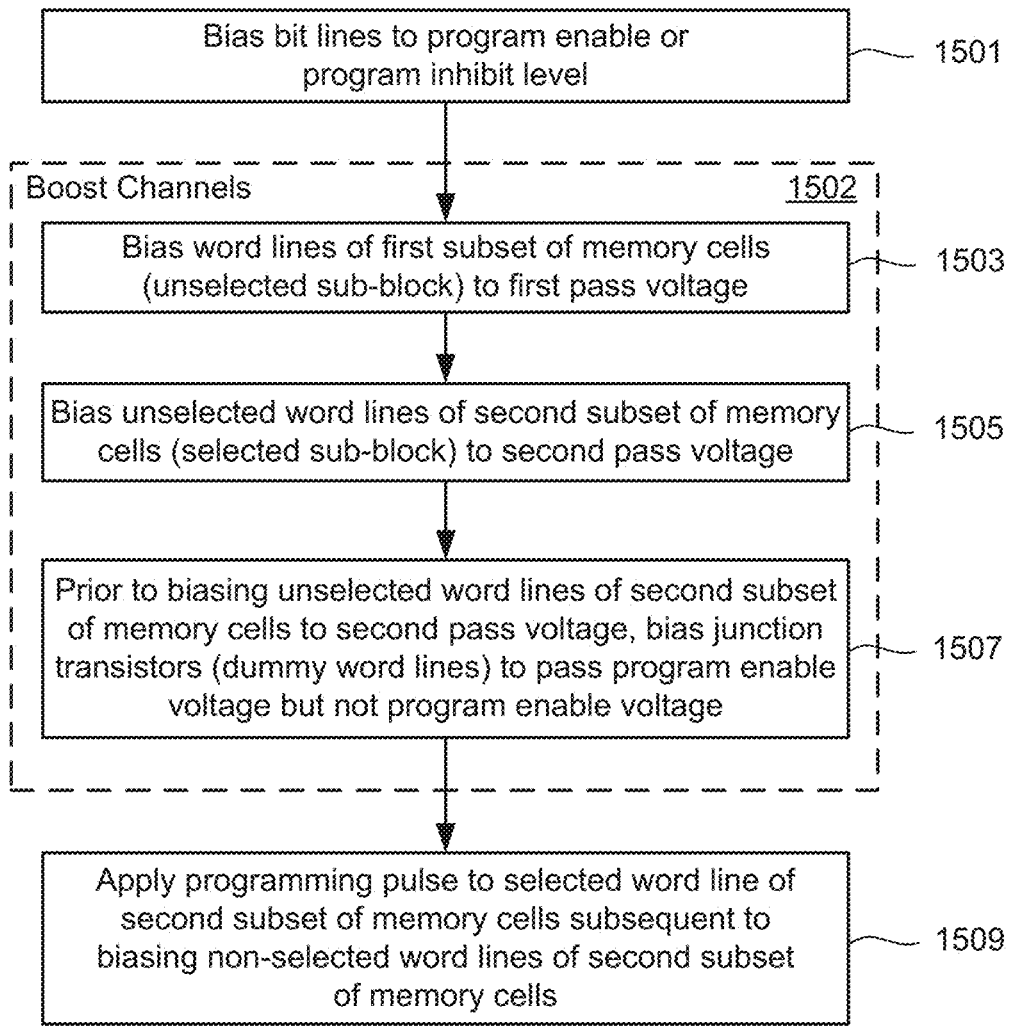
FIG. 15 is a flow chart describing one embodiment of a process for performing a memory operation for the programming of memory cells that includes a sub-block based self-boosting scheme.

FIG. 15 is a flow chart describing one embodiment of a process for performing a memory operation for the programming of memory cells that includes the sub-block based self-boosting scheme as described above. More specifically, FIG. 15 relates steps 604, 606, and 608 of FIG. 7 to the flows and waveforms of FIGS. 12A, 12B, FIGS. 13A, 13B, and FIGS. 14A, 14B. In particular, steps 1501, 1502, and 1509 correspond to steps 604, 606, and 608 for the PC value of the programming loop.

At step 1501, the bit lines are biased by the driver circuitry 214 and other elements of the column control circuitry 210 to either a program enable or program inhibit voltage, depending whether or not the memory cell on the corresponding NAND string from the selected word line has reached its target data state. In embodiments using quick pass write, the bit lines can also be biased a program partial inhibit voltage intermediate to the enable and inhibit levels. Boosting then occurs at step 1502.

The boosting of step 1502 can be one of the embodiments of FIGS. 12A, 12B, FIGS. 13A, 13B, or FIGS. 14A, 14B, for example. In these embodiments, the bit line biasing of step 1501 is performed prior to step 1502. For the first, non-selected subset of the word lines (e.g., upper sub-block), these are biased by the array drivers 224 to a first pass voltage (e.g., Vpass_Unsel_SB) at step 1503. At step 1505, the non-selected word lines of the second, selected subset of the word lines (e.g., lower sub-block) are biased by the array drivers 224 to a second pass voltage (e.g., Vpass_Sel_SB). The joint transistors are biased by the array drivers 224 by their corresponding control lines (e.g., the joint region dummy word lines WLDJ) at step 1507 to a level (e.g., V_WLDJ) that will let the joint region dummy memory cells or other joint transistors to pass the program enable voltage (and, in embodiments using quick pass write, the program partial inhibit voltage), but not the program inhibit voltage, from first subset of the memory cells to the second subset of the memory cells. Step 1507 is performed prior to step 1505 and, for the two stage embodiments of FIGS. 12A, 12B and FIGS. 13A, 13B, step 1503 is performed prior to 1507. Once the channels are boosted at step 1502, the programming pulse for the current program count loop is applied the array drivers 224 at step 1509.

As described above, the sub-block based self-boosting presents an alternative boosting scheme where conventional local self-boosting does not work well, such as in the example of reverse order programming. These techniques boost the whole of a selected sub-block while isolating the unselected sub-block, providing better boosting for the selected sub-block, while reducing pass voltage induced disturbs in the unselected sub-block. The sub-block based self-boosting can be used for pre-charging a sub-block when neither source side nor drain side conventional boosting pre-charge is available through use of the joint area dummy word line in an asynchronous, two-stage boosting. The embodiments described above use the joint region dummy word lines (WLDL, WLDU) as a select gate to cut-off program inhibited channels, but still pass the program enable Vss level, as well as the quick pass write level for embodiments that use this feature. Alternate embodiments may use one or more additional boundary word lines in addition to, or instead of, the WLDL, WLDU pair for this sub-block select gate function. In any of these variations, the asynchronous, two stage boosting method can be used to pre-charge a selected sub-block through channel charge sharing from the boosted, unselected sub-block.

The discussion above has been presented in the context of a memory structure having two tiers, corresponding to an upper sub-block SB0 and a lower sub-block SB1, separated by a joint region. Alternate embodiments can have additional numbers of tiers separating the memory structure into a corresponding number of sub-blocks, where dummy word lines (or other boundary transistors) at the joint regions can again be used for a select gate function. For example, in a three-tier embodiment, two-joint embodiment, the lowest sub-block could be programmed in reverse program order by biasing the "select gates" at both joints to V_WLDJ; the middle sub-block programmed in reverse order by biasing the upper joint "select gates" to V_WLDJ and the lower joint "select gates" at Vss to cut-off the lower sub-block; and upper sub-block written in normal order programming by biasing both joint region "select gates" at Vss to cut-off the lower and middle sub-blocks.

In one example implementation, an apparatus includes a control circuit configured to connect to a first NAND string, where the first NAND comprises a plurality of non-volatile memory cells connected in series between a source line and a bit line, including a first subset of the memory cells, a second subset of the memory cells connected between the first subset of the memory cells and the source line, and one or more joint transistors connected in series with and in between the first subset and the second subset of the memory cells. The control circuit is configured to independently erase the first subset and second subset of the memory cells, and also to perform a program operation on the first NAND string. The program operation on the first NAND string is performed by: biasing the bit line to one of either a program enable voltage or a program inhibit voltage; biasing the memory cells of the first subset to a first pass voltage; biasing non-selected memory cells of the second subset to a second pass voltage; prior to biasing the non-selected memory cells of the second subset to the second pass voltage, biasing the one or more joint transistors to a voltage level configured to pass the program enable voltage, but not the program inhibit voltage, from first subset of the memory cells to the second subset of the memory cells; and subsequent to biasing the non-selected memory cells of the second subset to the second pass voltage, applying a programming pulse to a first selected memory cell of the second subset.

One embodiment includes a method that includes biasing each of a plurality of bit lines of a non-volatile memory array to one of either a program enable voltage or a program inhibit voltage. The array comprises a plurality of NAND strings each connected between a corresponding one of the bit lines and one of one or more source lines, each of the NAND strings comprising a first subset of memory cells each connected to a corresponding one of a first subset of word lines, a second subset of memory cells each connected to a corresponding one of a second subset of word lines and connected between the first subset of the memory cells and the source line, and one or more joint transistors each connect to a corresponding control line and connected in series with and in between the first subset and the second subset of the memory cells. Subsequent to biasing the bit lines, the method includes performing a channel boosting operation on the plurality of NAND strings by: biasing the first subset of word lines to a first pass voltage; biasing non-selected word lines of the second subset of word lines to a second pass voltage; and prior to biasing the non-selected word lines of the second subset of word lines to the second pass voltage, biasing the corresponding control lines of the one or more joint transistors to a voltage level configured to pass the program enable voltage, but not the program inhibit voltage, from first subset of the memory cells to the second subset of the memory cells. The method also includes applying a programming pulse to a first selected word line of the second subset of word lines subsequent to subsequent to biasing the non-selected word lines of the second subset of word lines to the second pass voltage.

One embodiment includes a non-volatile memory device and one or more control circuits connected to the array. The array includes a plurality of NAND strings each connected between a corresponding one of a plurality of bit lines and one of one or more source lines, each of the NAND strings comprising a first subset of memory cells each connected to a corresponding one of a first subset of word lines, a second subset of memory cells each connected to a corresponding one of a second subset of word lines and connected between the first subset of the memory cells and the source line, and one or more joint transistors each connect to a corresponding control line and connected in series with and in between the first subset and the second subset of the memory cells. The one or more control circuits are configured to: bias each of the bit lines to one of plurality of bit line voltage levels, including a program enable voltage and a program inhibit voltage; subsequent to biasing the bit lines, bias the first subset of word lines to a first pass voltage and bias non-selected word lines of the second subset of word lines to a second pass voltage; prior to biasing the non-selected word lines of the second subset of word lines to the second pass voltage, bias the corresponding control lines of the one or more joint transistors to a voltage level configured to pass the program enable voltage, but not the program inhibit voltage, from first subset of the memory cells to the second subset of the memory cells; and subsequent to biasing the non-selected word lines of the second subset of word lines to the second pass voltage, apply a programming pulse to a first selected word line of the second subset of word lines.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a control circuit configured to connect to a first NAND string, the first NAND comprising a plurality of non-volatile memory cells connected in series between a source line and a bit line, including a first subset of the memory cells, a second subset of the memory cells connected between the first subset of the memory cells and the source line, and one or more joint transistors connected in series with and in between the first subset and the second subset of the memory cells, the control circuit configured to:
independently erase either of the first subset of the memory cells and the second subset of the memory cells, where, to erase one but not both of the first subset of the memory cells and the second subset of the memory cells, the control circuit is configured to bias one or more of the joint transistors to be in an off state; and
subsequent to erasing the second subset of the memory cells, but not the first subset of the memory cells, perform a program operation on the first subset of the memory cells, sequentially programming the first subset of the memory cells from memory cells nearer the one or more joint transistors toward memory cells nearer the source line, where, to perform the program operation on the first subset of the memory cells the control circuit is configured to:
biasing the bit line to one of either a program enable voltage or a program inhibit voltage;
biasing the memory cells of the first subset to a first pass voltage;
biasing non-selected memory cells of the second subset to a second pass voltage;
prior to biasing the non-selected memory cells of the second subset to the second pass voltage, biasing the one or more joint transistors to a voltage level configured to pass the program enable voltage, but not the program inhibit voltage, from first subset of the memory cells to the second subset of the memory cells; and subsequent to biasing the non-selected memory cells of the second subset to the second pass voltage, applying a programming pulse to a first selected memory cell of the second subset.

2. The apparatus of claim 1, wherein the control circuit is formed on a control die, the apparatus further comprising:
a memory die including the first NAND string, the memory die formed separately from and bonded to the control die.

3. The apparatus of claim 1, wherein, in performing the program operation on the first NAND string, the control circuit is further configured to:
bias the memory cells of the first subset to the first pass voltage prior to biasing the one or more joint transistors to the voltage level configured to pass the program enable voltage, but not the program inhibit voltage.

4. The apparatus of claim 1, wherein, in performing the program operation on the first NAND string, the control circuit is further configured to:
subsequent to applying the programming pulse to a first selected memory cell of the second subset, apply a subsequent programming pulse to a second selected memory cell of the second subset, wherein the second selected memory cell is connected between the first selected memory cell and the source line.

5. The apparatus of claim 1, wherein the second pass voltage is greater than the first pass voltage.

6. The apparatus of claim 1, wherein the first pass voltage has a value dependent upon a number of memory cells of the first subset in an erased state.

7. The apparatus of claim 1, further comprising:
an array of non-volatile memory cells formed of a plurality of NAND strings, including the first NAND string, having a three-dimensional architecture in which each of the NAND strings runs perpendicularly to a surface of the substrate, and the word lines, bit lines and the one or more source lines run parallel to the surface of the substrate.

8. The apparatus of claim 1, further comprising:
an array of non-volatile memory cells, including the first NAND string, wherein the one or more joint transistors are dummy memory cells.

9. The apparatus of claim 1, wherein the control circuit is further configured to:
bias the bit line to a program partial inhibit voltage having a voltage level intermediate to the program enable voltage and the program inhibit voltage, wherein the one or more joint transistors are biased to a level to pass the program partial inhibit voltage.

10. A method, comprising:
erasing a second subset of memory cells, but not a first subset of the memory cells, of a non-volatile memory array, the array comprising a plurality of NAND strings each connected between a corresponding one of a plurality of bit lines and one of one or more source lines, each of the NAND strings comprising the first subset of memory cells each connected to a corresponding one of a first subset of word lines, the second subset of memory cells each connected to a corresponding one of a second subset of word lines and connected between the first subset of the memory cells and the source line, and one or more joint transistors each connect to a corresponding control line and connected in series with and in between the first subset and the second subset of the memory cells;
subsequent to erasing the second subset of the memory cells, but not the second subset of the memory cells, performing a programming operation on the first subset of the memory cells in which the first subset of the memory cells are sequentially programed from memory cells nearer the one or more joint transistors toward memory cells nearer the source line, comprising:
biasing each of a plurality of the bit lines to one of plurality of bit line voltage levels, including a program enable voltage and a program inhibit voltage;
subsequent to biasing the bit lines, performing a channel boosting operation on the plurality of NAND strings by:
biasing the first subset of word lines to a first pass voltage;
biasing non-selected word lines of the second subset of word lines to a second pass voltage; and
prior to biasing the non-selected word lines of the second subset of word lines to the second pass voltage, biasing the corresponding control lines of the one or more joint transistors to a voltage level configured to pass the program enable voltage, but not the program inhibit voltage, from the first subset of the memory cells to the second subset of the memory cells; and
applying a programming pulse to a first selected word line of the second subset of word lines subsequent to biasing the non-selected word lines of the second subset of word lines to the second pass voltage.

11. The method of claim 10, wherein:
biasing the first subset of word lines to the first pass voltage is performed prior to biasing the corresponding control lines of the one or more joint transistors.

12. The method of claim 10, wherein the second pass voltage is greater than the first pass voltage.

13. The method of claim 10, wherein the first pass voltage has a value dependent upon a number of memory cells of the first subset in an erased state.

14. The method of claim 10, further comprising:
subsequent to applying the programming pulse to the first selected word line of the second subset of word lines, applying a subsequent programming pulse to a second selected word line of the second subset of word lines, wherein the memory cells connected to the second selected word line are connected between the memory cells connected to the first selected word line and the source line.

15. The method of claim 10, wherein the bit line voltage levels further include a program partial inhibit voltage and wherein the voltage level to which the corresponding control lines of the one or more joint transistors are biased is configured to pass the program partial inhibit voltage.

16. A non-volatile memory device, comprising:
an array comprising a plurality of NAND strings each connected between a corresponding one of a plurality of bit lines and one of one or more source lines, each of the NAND strings comprising a first subset of memory cells each connected to a corresponding one of a first subset of word lines, a second subset of memory cells each connected to a corresponding one of a second subset of word lines and connected between the first subset of the memory cells and the source line, and one or more joint transistors each connect to a corresponding control line and connected in series with and in between the first subset and the second subset of the memory cells; and one or more control circuits connected to the array and configured to independently erase either of the first subset of the memory cells and the second subset of the memory cells, where, to erase one but not both of the first subset of the memory cells and the second subset of the memory cells, the control circuit is configured to bias one or more of the joint transistors to be in an off state; and subsequent to erasing the second subset of the memory cells, but not the second subset of the memory cells, perform a program operation on the first subset of the memory cells, sequentially programming the first subset of the memory cells from memory cells nearer the one or more joint transistors toward memory cells nearer the source line, where, to perform the program operation on the first subset of the memory cells the one or more control circuit are configured to:

bias each of the bit lines to one of plurality of bit line voltage levels, including a program enable voltage and a program inhibit voltage;

subsequent to biasing the bit lines, bias the first subset of word lines to a first pass voltage and bias non-selected word lines of the second subset of word lines to a second pass voltage;

prior to biasing the non-selected word lines of the second subset of word lines to the second pass voltage, bias the corresponding control lines of the one or more joint transistors to a voltage level configured to pass the program enable voltage, but not the program inhibit voltage, from first subset of the memory cells to the second subset of the memory cells; and subsequent to biasing the non-selected word lines of the second subset of word lines to the second pass voltage, apply a programming pulse to a first selected word line of the second subset of word lines.

17. The non-volatile memory device of claim 16, wherein the array is formed over a substrate and has a three dimensional NAND architecture in which each of the NAND strings runs perpendicularly to a surface of the substrate, and the word lines, bit lines and the one or more source lines run parallel to the surface of the substrate.

18. The non-volatile memory device of claim 16, wherein the one or more control circuits are further configured to:
bias the first subset of word lines to the first pass voltage prior to biasing the corresponding control lines of the one or more joint transistors.

19. The non-volatile memory device of claim 16, wherein the one or more control circuits are further configured to:
bias the first subset of word lines to the first pass voltage prior to biasing the second subset of word lines.

* * * * *